(12) United States Patent
Snyder et al.

(10) Patent No.: US 8,299,681 B2
(45) Date of Patent: Oct. 30, 2012

(54) REMOTELY ADJUSTABLE REACTIVE AND RESISTIVE ELECTRICAL ELEMENTS AND METHOD

(75) Inventors: Carl J. Snyder, Minneapolis, MN (US); John Thomas Vaughan, Jr., Stillwater, MN (US); Charles A. Lemaire, Apple Valley, MN (US)

(73) Assignee: Life Services, LLC, Minneapolis, MN (US)

( * ) Notice: Subject to any disclaimer, the term of this patent is extended or adjusted under 35 U.S.C. 154(b) by 344 days.

(21) Appl. No.: 12/719,841

(22) Filed: Mar. 8, 2010

(65) Prior Publication Data

US 2012/0242550 A1 Sep. 27, 2012

Related U.S. Application Data

(60) Provisional application No. 61/158,345, filed on Mar. 6, 2009.

(51) Int. Cl.
*H01L 41/09* (2006.01)
(52) U.S. Cl. ............ 310/318; 310/316.01; 310/317; 310/328
(58) Field of Classification Search ............ 310/311, 310/316, 1, 317, 318, 328
See application file for complete search history.

(56) References Cited

U.S. PATENT DOCUMENTS

| | | | |
|---|---|---|---|
| 4,682,125 A | 7/1987 | Harrison et al. | |
| 4,763,076 A | 8/1988 | Arakawa et al. | |
| 4,894,589 A * | 1/1990 | Borowiec | 315/248 |
| 4,947,119 A | 8/1990 | Ugurbil et al. | |
| 5,557,247 A | 9/1996 | Vaughan, Jr. | |
| 5,714,831 A * | 2/1998 | Walker et al. | 310/316.01 |
| 5,744,957 A | 4/1998 | Vaughan, Jr. | |
| 5,886,596 A | 3/1999 | Vaughan, Jr. | |
| 5,908,386 A | 6/1999 | Ugurbil et al. | |

(Continued)

FOREIGN PATENT DOCUMENTS

CA 2042145 * 1/1992

(Continued)

OTHER PUBLICATIONS

Cho, Y.K., et al., "Noninvasive measurements of transmural myocardial metabolites using 3-D (31)P NMR spectroscopy.", "Am J Physiology", 2001, pp. H489-H497, vol. 280, No. 1.

(Continued)

*Primary Examiner* — Thomas Dougherty
(74) *Attorney, Agent, or Firm* — Charles A. Lemaire; Lemaire Patent Law Firm, P.L.L.C.

(57) ABSTRACT

Apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

27 Claims, 14 Drawing Sheets

U.S. PATENT DOCUMENTS

| | | | |
|---|---|---|---|
| 6,002,251 A | 12/1999 | Sun | |
| 6,495,069 B1 | 12/2002 | Lussey et al. | |
| 6,633,161 B1 | 10/2003 | Vaughan, Jr. | |
| 6,636,037 B1 | 10/2003 | Ou-Yang | |
| 6,650,116 B2 | 11/2003 | Garwood et al. | |
| 6,788,056 B2 | 9/2004 | Vaughan, Jr. et al. | |
| 6,788,057 B1 | 9/2004 | Petropoulos et al. | |
| 6,788,058 B1 | 9/2004 | Petropoulos et al. | |
| 6,930,480 B1 | 8/2005 | Fujita et al. | |
| 6,946,840 B1 | 9/2005 | Zou et al. | |
| 6,958,607 B2 | 10/2005 | Vaughan, Jr. et al. | |
| 6,969,992 B2 | 11/2005 | Vaughan, Jr. et al. | |
| 6,975,115 B1 | 12/2005 | Fujita et al. | |
| 6,977,502 B1 | 12/2005 | Hertz | |
| 6,980,002 B1 | 12/2005 | Petropoulos et al. | |
| 7,023,209 B2 | 4/2006 | Zhang et al. | |
| 7,042,222 B2 | 5/2006 | Zheng et al. | |
| 7,084,631 B2 | 8/2006 | Qu et al. | |
| 7,268,554 B2 | 9/2007 | Vaughan, Jr. | |
| 7,279,899 B2 | 10/2007 | Michaeli et al. | |
| 7,403,006 B2 | 7/2008 | Garwood et al. | |
| 7,436,103 B2 * | 10/2008 | Kawakubo et al. | 310/333 |
| 7,514,926 B2 | 4/2009 | Adriany et al. | |
| 7,598,739 B2 | 10/2009 | Vaughan, Jr. et al. | |
| 7,633,293 B2 | 12/2009 | Olson et al. | |
| 7,672,650 B2 | 3/2010 | Sorrells et al. | |
| 7,710,117 B2 | 5/2010 | Vaughan et al. | |
| 7,800,368 B2 | 9/2010 | Vaughan et al. | |
| 2003/0128495 A1 * | 7/2003 | Obert et al. | 361/298.3 |
| 2006/0001426 A1 | 1/2006 | Vaughan et al. | |
| 2006/0279284 A1 | 12/2006 | Vaughan, Jr. | |
| 2009/0115417 A1 | 5/2009 | Akgun et al. | |
| 2009/0237077 A1 | 9/2009 | Vaughan et al. | |
| 2009/0264733 A1 | 10/2009 | Corum et al. | |
| 2010/0090565 A1 * | 4/2010 | Bhaskaran et al. | 310/330 |
| 2011/0234351 A1 * | 9/2011 | Kawarai et al. | 336/30 |
| 2012/0062230 A1 * | 3/2012 | Vaughan et al. | 324/318 |

FOREIGN PATENT DOCUMENTS

| | | |
|---|---|---|
| WO | WO 2005111645 | 11/2005 |
| WO | WO 2006014260 | 2/2006 |
| WO | WO 2006121949 | 11/2006 |
| WO | WO 2008064365 | 5/2008 |
| WO | WO 2010045457 | 4/2010 |

OTHER PUBLICATIONS

Nelder, J.A., et al., "A simplex method for function minimization", "Comput J.", 1965, pp. 308-313, vol. 7, No. 4.

Sung K., et al., "B1+ Compensation in 3T Cardiac Imaging Using Short 2DRF Pulses", "Magnetic Resonance in Medicine", 2008, pp. 441-446, vol. 59, No. 3.

Vaughan, J.T., et al., "Clinical Imaging at 7T with a 16 Channel Whole Body Coil and 32 Receive Channels.", "Proceedings 17th Scientific Meeting, International Society for Magnetic Resonance in Medicine", Apr. 2009.

* cited by examiner

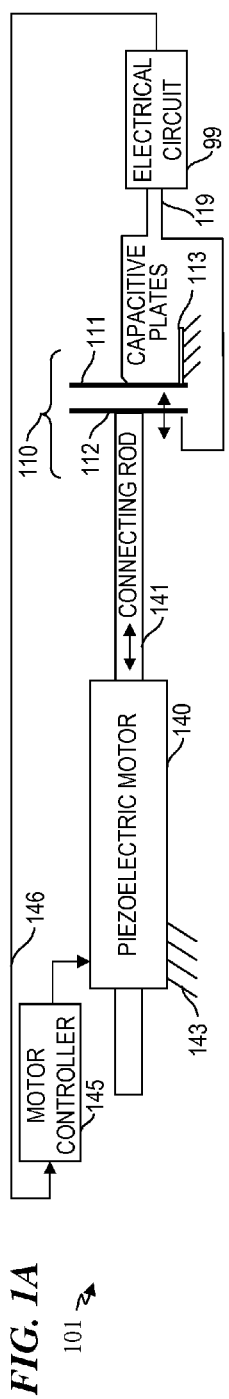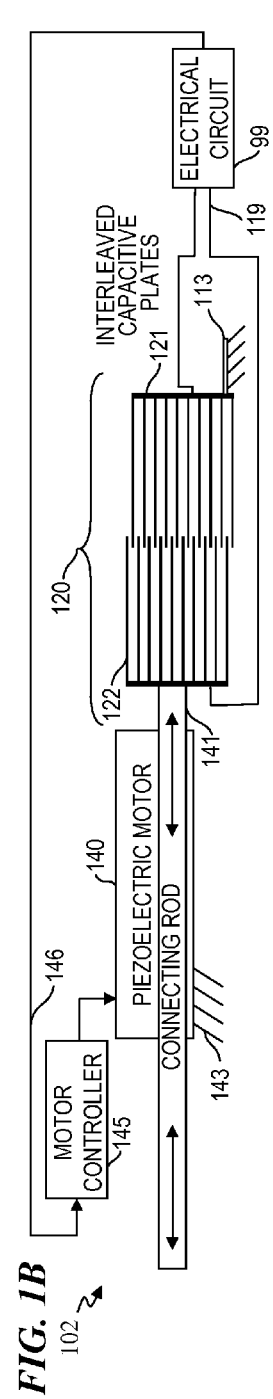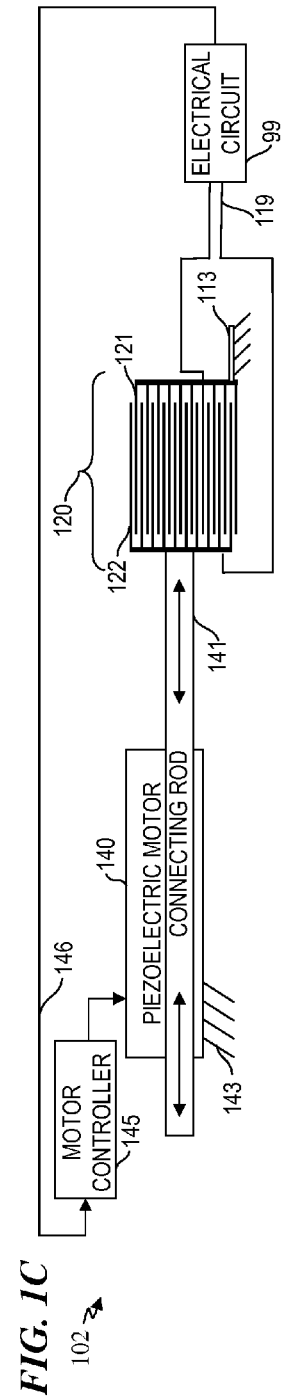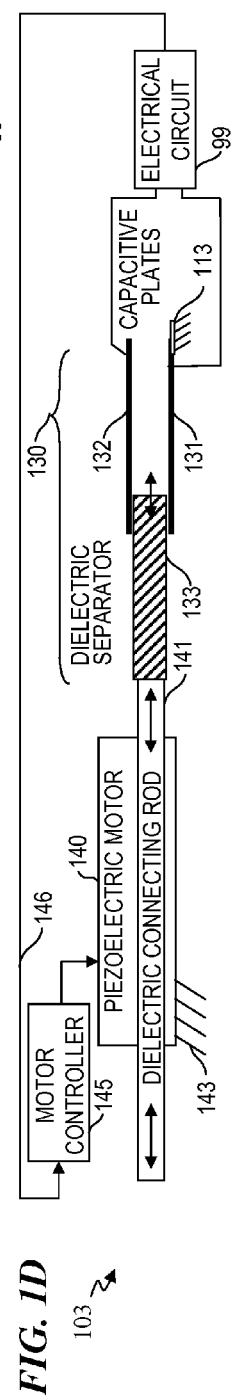

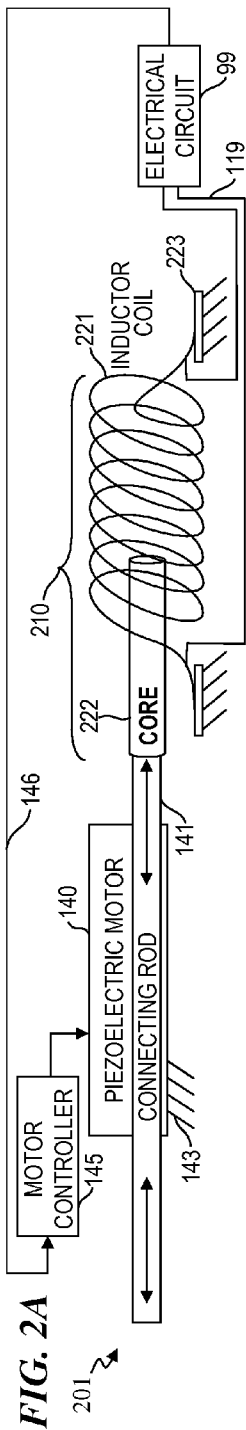
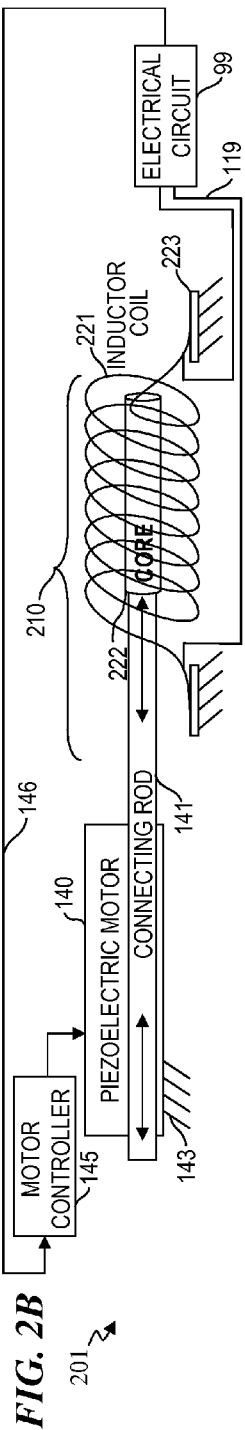
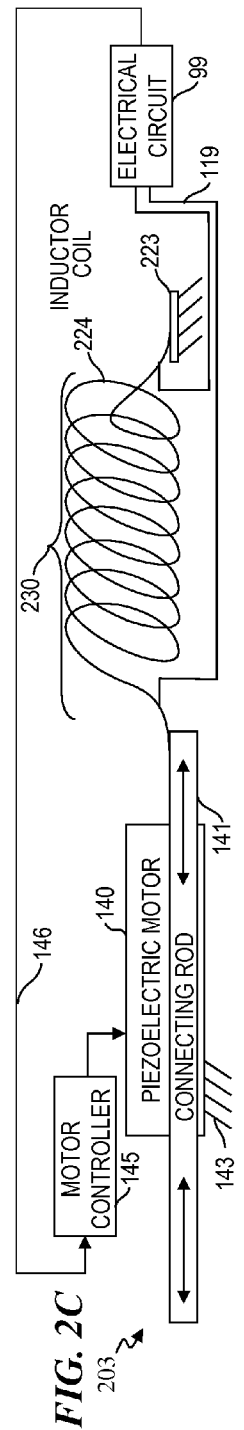
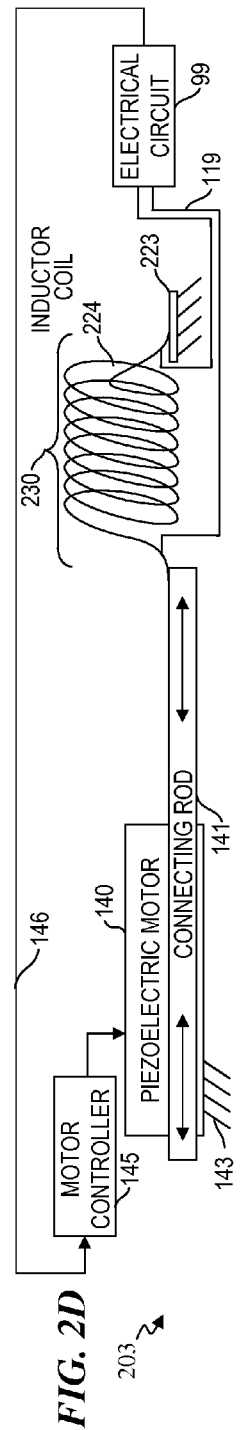

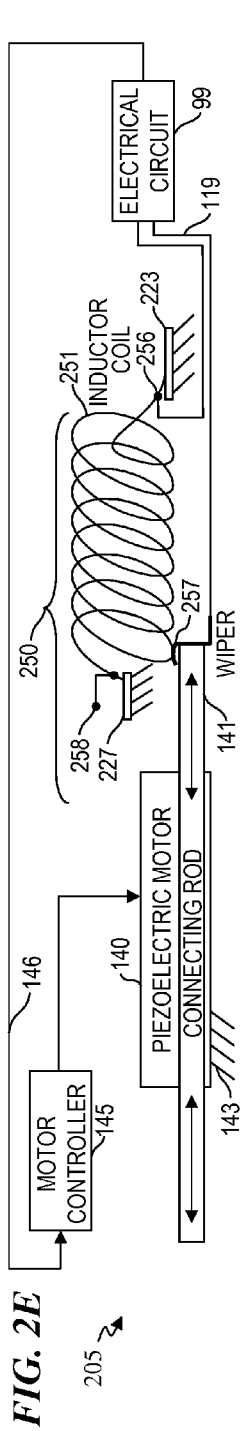
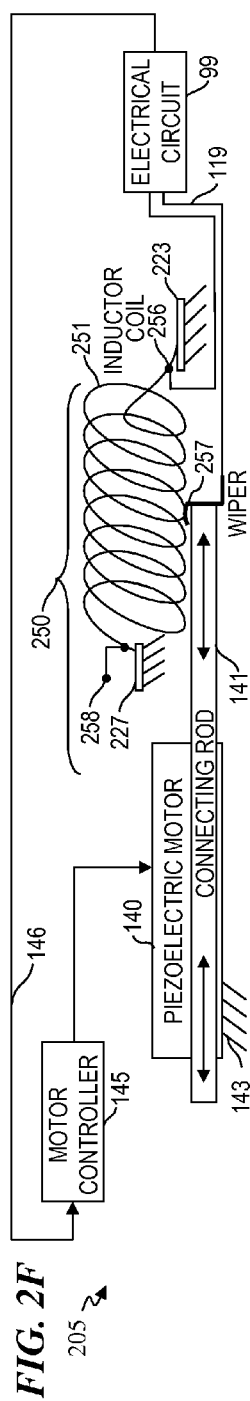
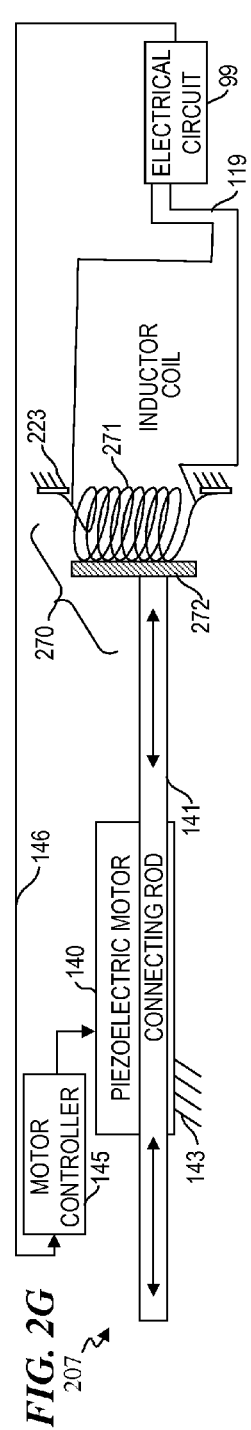
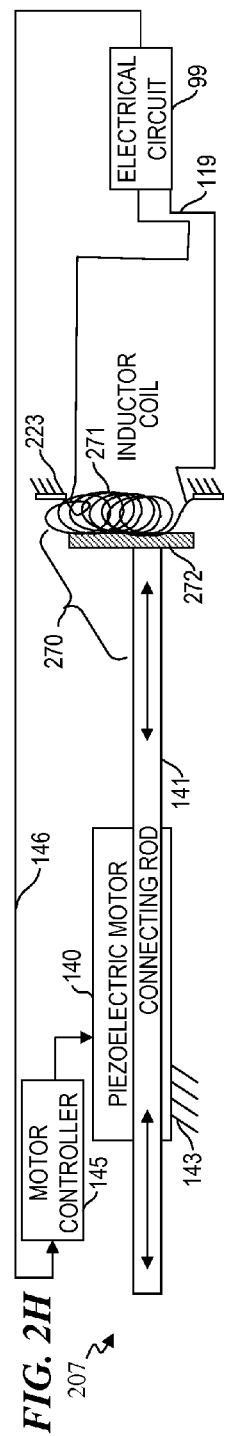
FIG. 2E
FIG. 2F
FIG. 2G
FIG. 2H

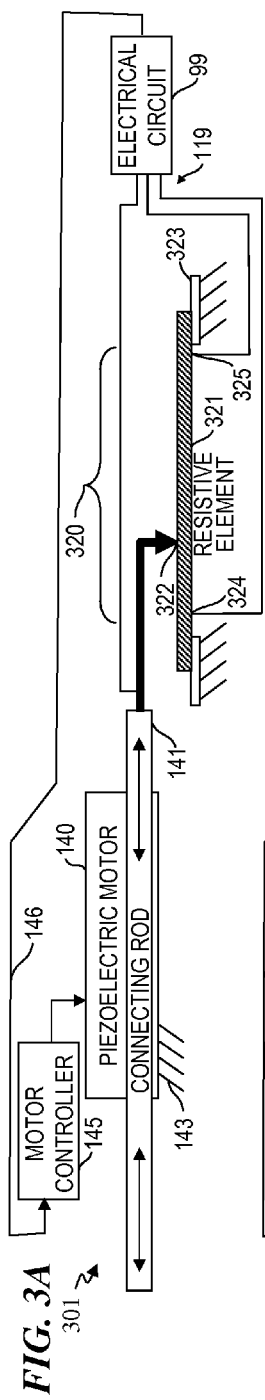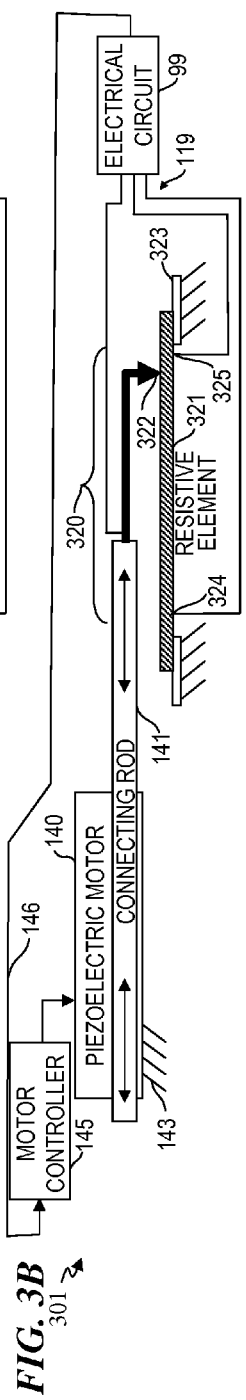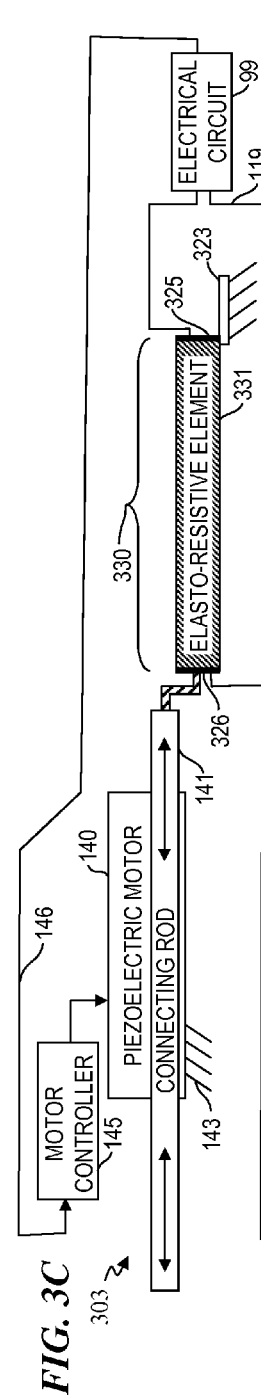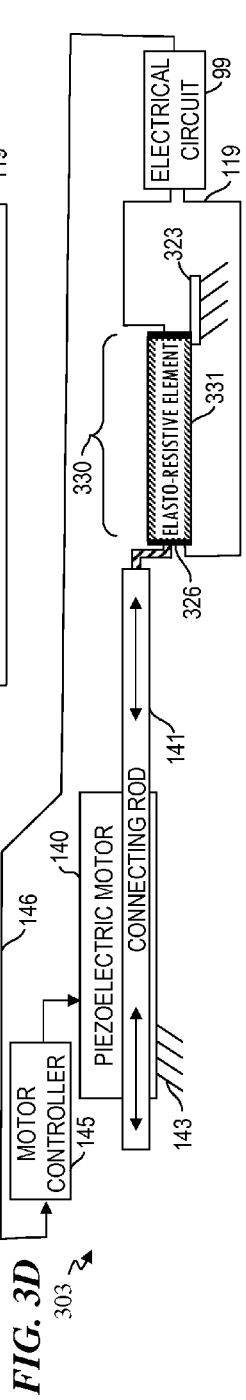

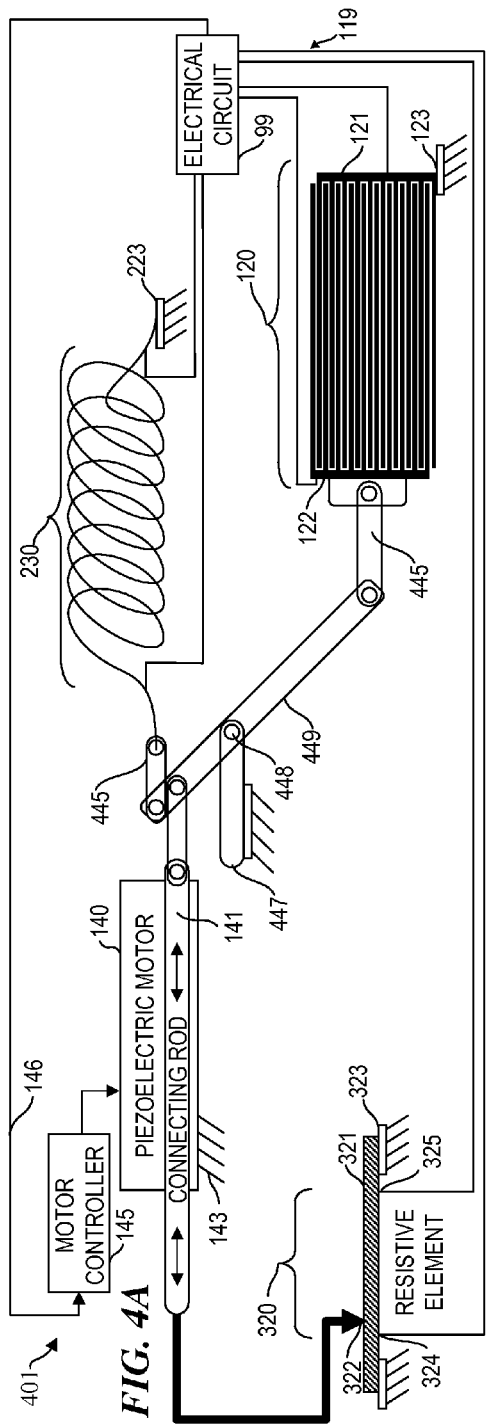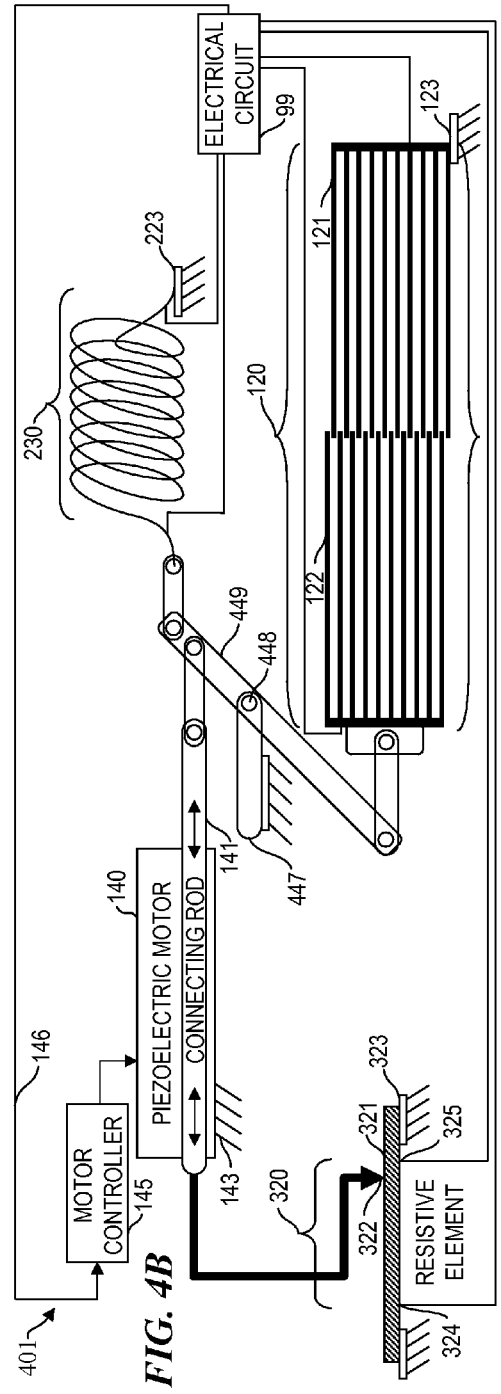

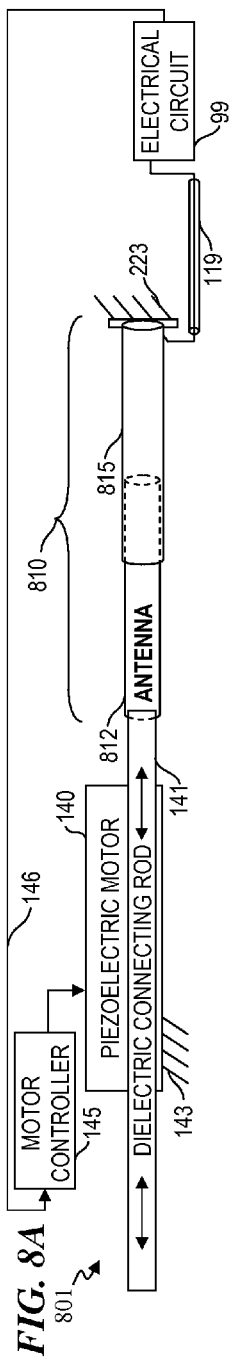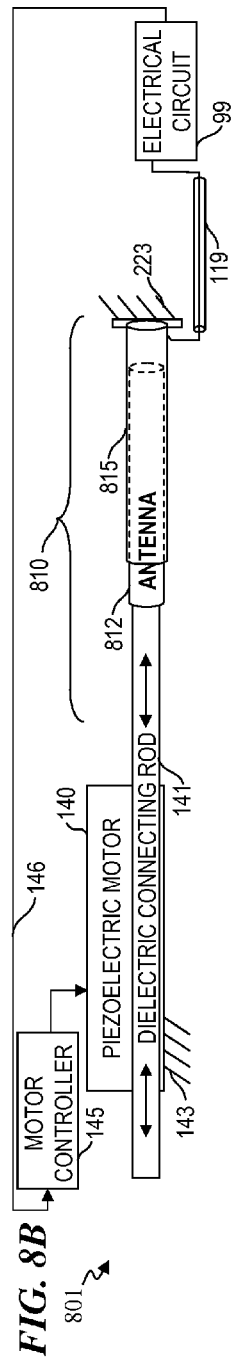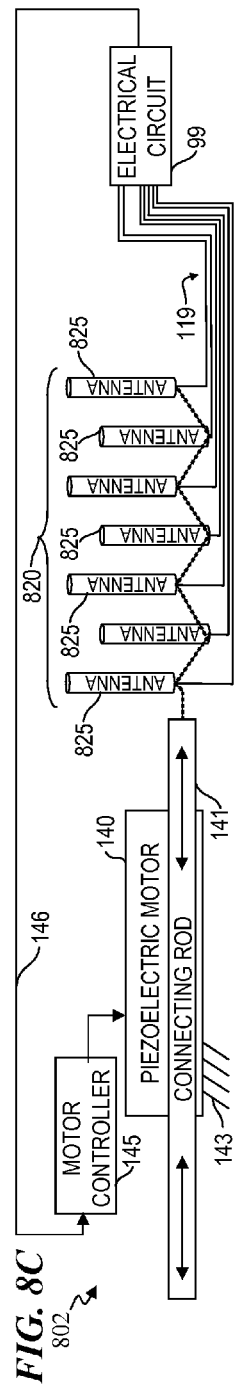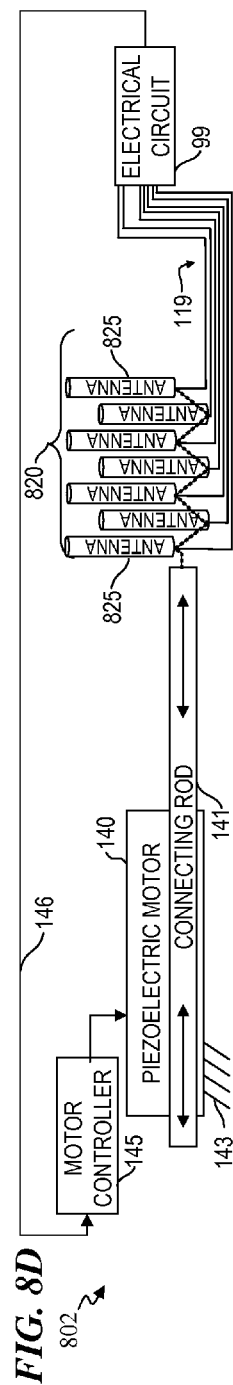

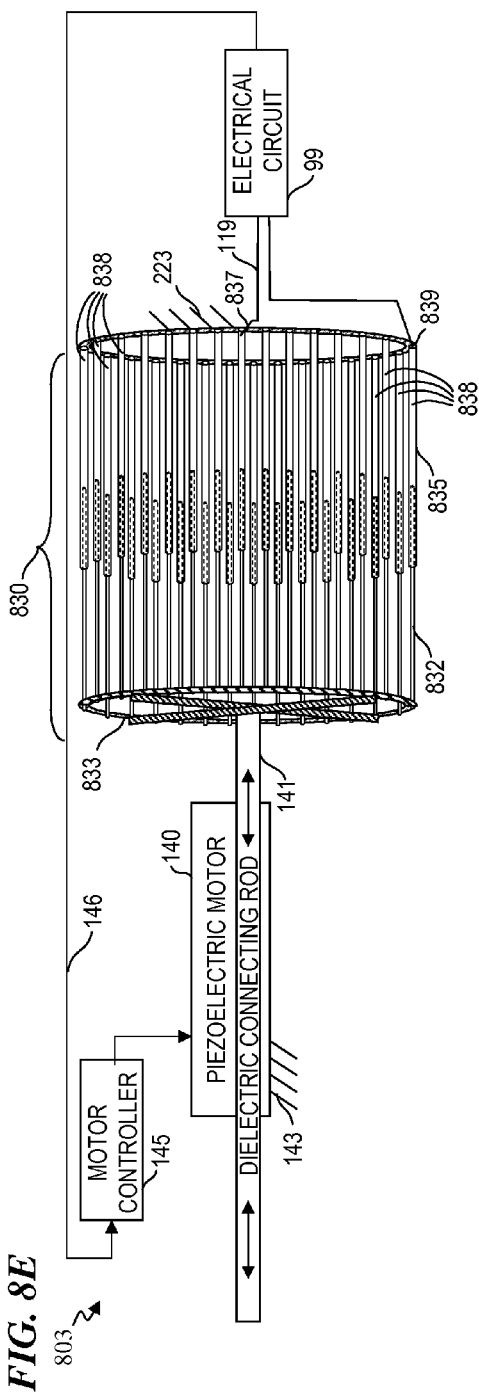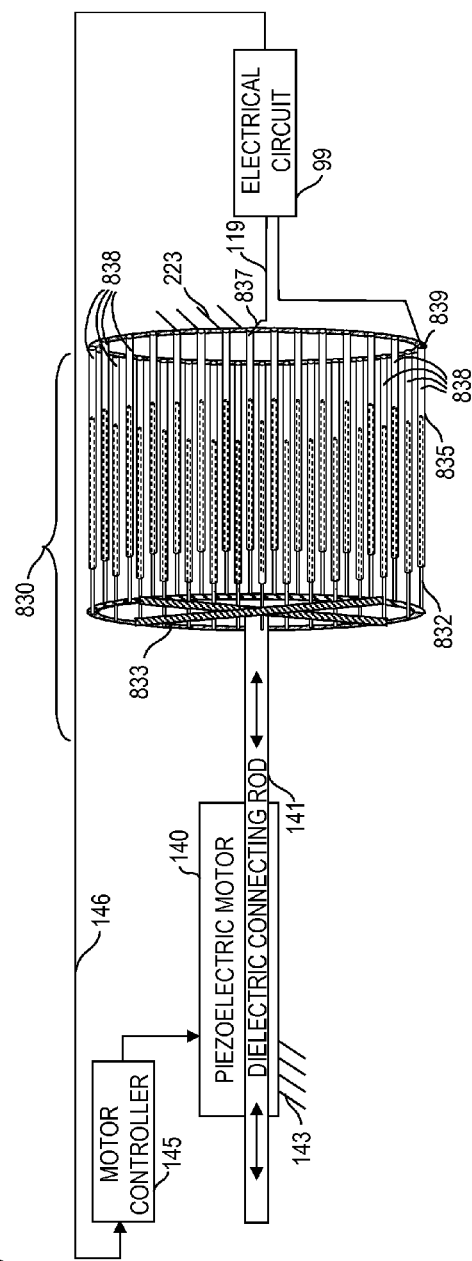

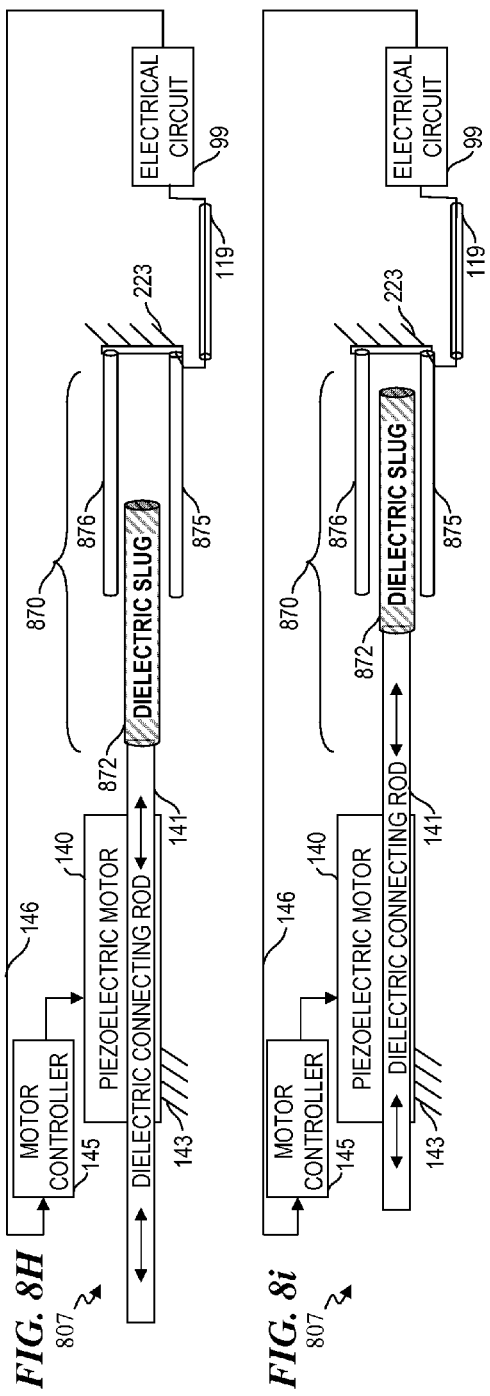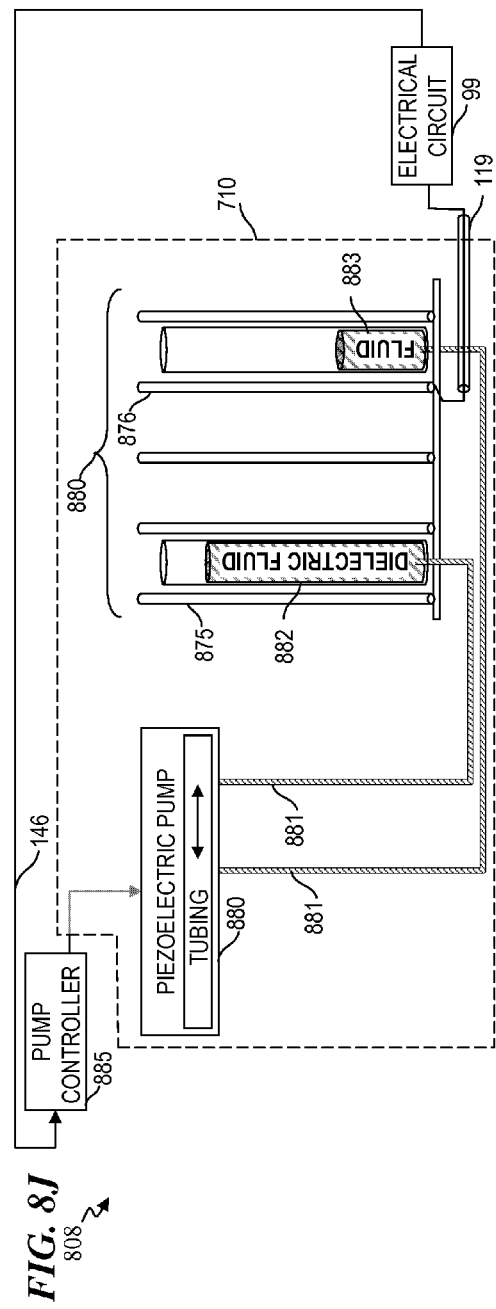

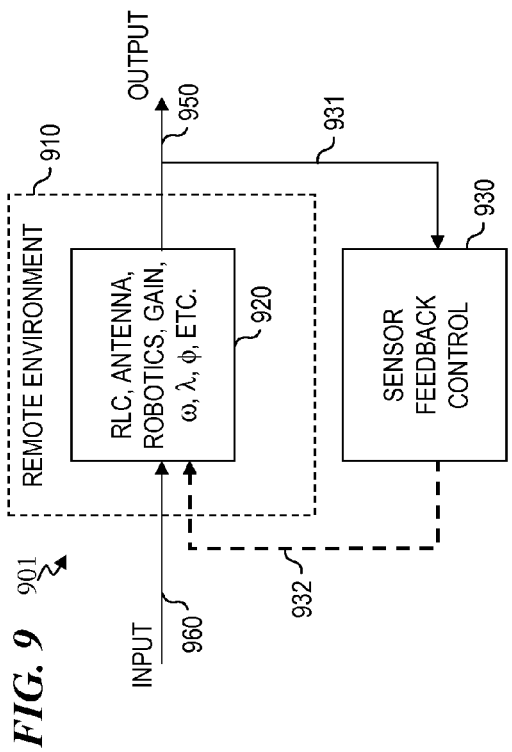
FIG. 9
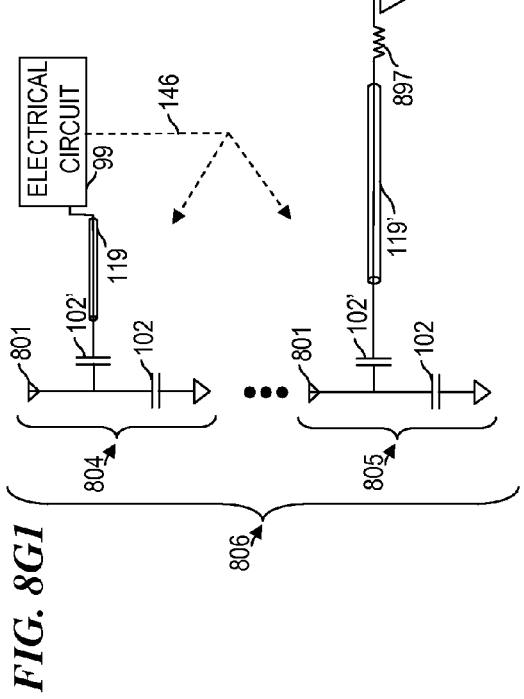
FIG. 8G1
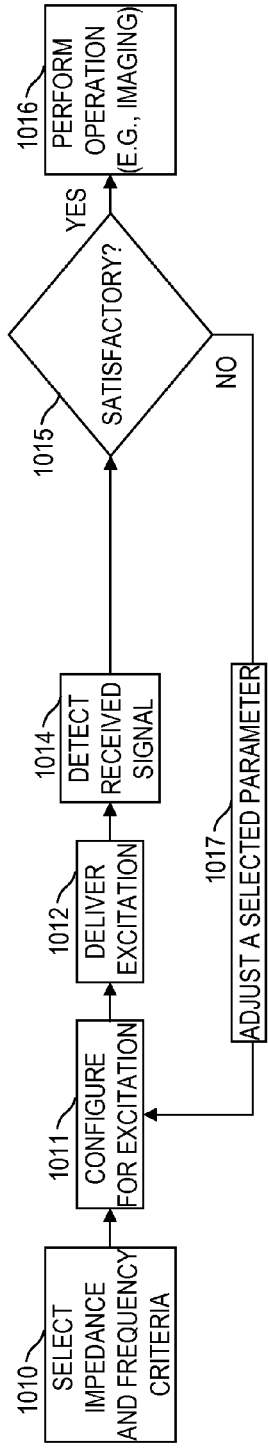
FIG. 10

REMOTELY ADJUSTABLE REACTIVE AND RESISTIVE ELECTRICAL ELEMENTS AND METHOD

CROSS-REFERENCE TO RELATED APPLICATIONS

This application claims priority benefit under 35 U.S.C. §119(e) to U.S. Provisional Patent Application No. 61/158,345 filed on Mar. 6, 2009, titled "REMOTELY ADJUSTABLE REACTIVE AND RESISTIVE ELECTRICAL ELEMENTS AND METHOD," which is incorporated herein by reference in its entirety.

FIELD OF THE INVENTION

This invention relates to the field of variable resistance-inductance-capacitance (R-L-C) elements, and more specifically to a method and apparatus of electrically controlling a mechanical movement device (such as a linear positioner, rotary motor, or pump) that selectively controls an electrical element to vary, and maintain at a selected value, its electrical resistance, inductance, and/or capacitance—and, in some embodiments, the components are compatible with and function in high fields (such as a magnetic field of up to and exceeding one tesla or even ten tesla or more and/or an electric field of many thousands of volts per meter).

BACKGROUND OF THE INVENTION

Conventional electrical components that permitted one to vary resistance, inductance, and/or capacitance under electrical control typically have somewhat limited component values available and are not compatible with being located in high fields (e.g., the fields of 1 tesla or more that are typically found in high-energy physics experiments such as the $9 billion Large Hadron Collider that has been 20 years in making and is still being modified to be able to operate).

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. titled "Polymer composition," is incorporated herein by reference. Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

There is a long-felt need for components having resistance, inductance, and/or capacitance values that are variable under electrical control and are compatible with being operated in extremely high electromagnetic fields.

SUMMARY OF THE INVENTION

The present invention provides resistors, inductors, capacitors, and/or antenna elements that have their electrical-circuit values controlled by one or more electrically controlled non-magnetic mechanical movement devices (such as linear positioners or rotary motors (which move a solid material), or pumps (which move a liquid or gas)). In some embodiments, the electrically controlled mechanical movement devices (such as piezo-electrical linear motors, micro-electronic mechanical-system (MEMS) mechanical actuators or MEMS pumps) and other elements (which are used to make the resistors, inductors, capacitors, and/or antenna elements) include metals that have only substantially non-magnetic components such that the resistors, inductors, capacitors, robotic arms or similar mechanical devices, and/or antenna elements and the mechanical positioner(s) or pump(s) that adjust their variable values can be placed and operated within and/or near an extremely high electric field of many thousands of volts per meter (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

In other embodiments, the present invention provides the ability to adjust very sensitive circuits that do not involve high fields, but instead involve very low fields (such as within completely enclosed Faraday cages (which block low-frequency external fields) having radio-frequency (RF) shielding (which block high-frequency external fields) that are measuring very small parameters such as extremely low-voltage circuits where the presence of a person or magnetic mechanical movement device (such as a magnetic linear positioner, rotary motor, or pump) would change the field, but which use the mechanical movement device(s) to adjust the configuration of RLC (resistive-inductive-capacitive) components without modifying fields or introducing extraneous capacitances or inductances.

BRIEF DESCRIPTION OF THE DRAWINGS

FIG. 1A is a block diagram of a variable capacitor subsystem 101 having a variable capacitor 110 according to one embodiment of the present invention.

FIG. 1B is a block diagram of a variable capacitor subsystem 102 having a variable capacitor 120 according to one embodiment of the present invention, wherein variable capacitor 102 is set to a first capacitance value.

FIG. 1C is a block diagram of variable capacitor subsystem 102 as was shown in FIG. 1B, but wherein variable capacitor 120 is set to a second capacitance value.

FIG. 1D is a block diagram of a variable capacitor subsystem 103 having a variable capacitor 130 according to one embodiment of the present invention, wherein variable capacitor 130 is set to a first capacitance value.

FIG. 2A is a block diagram of a variable inductor subsystem 201 having a variable inductor 210 according to one embodiment of the present invention, wherein variable inductor 201 is set to a first inductance value.

FIG. 2B is a block diagram of variable inductor subsystem 201 according to one embodiment of the present invention, wherein variable inductor 210 is set to a second inductance value.

FIG. 2C is a block diagram of a variable inductor subsystem 203 having a variable inductor 230 according to one embodiment of the present invention, wherein variable inductor 203 is set to a first inductance value.

FIG. 2D is a block diagram of variable inductor subsystem 203 according to one embodiment of the present invention, wherein variable inductor 230 is set to a second inductance value.

FIG. 2E is a block diagram of a variable inductor subsystem 205 according to one embodiment of the present invention, wherein variable inductor 250 is set to a first inductance value.

FIG. 2F is a block diagram of variable inductor subsystem 205 according to one embodiment of the present invention, wherein variable inductor 250 is set to a second inductance value.

FIG. 2G is a block diagram of a variable inductor subsystem 207 according to one embodiment of the present invention, wherein variable inductor 270 is set to a first inductance value.

FIG. 2H is a block diagram of variable inductor subsystem 207 according to one embodiment of the present invention, wherein variable inductor 270 is set to a second inductance value.

FIG. 3A is a block diagram of a variable resistor subsystem 301 according to one embodiment of the present invention, wherein variable resistor 320 is set to a first resistance value.

FIG. 3B is a block diagram of variable resistor subsystem 301 according to one embodiment of the present invention, wherein variable resistor 320 is set to a second resistance value.

FIG. 3C is a block diagram of a variable resistor subsystem 303 according to one embodiment of the present invention, wherein variable resistor 330 is set to a first resistance value.

FIG. 3D is a block diagram of variable resistor subsystem 303 according to one embodiment of the present invention, wherein variable resistor 330 is set to a second resistance value.

FIG. 4A is a block diagram of a variable resistor-inductor-capacitor subsystem 401 according to one embodiment of the present invention, wherein variable resistor 320 is set to a first resistance value, variable inductor 230 is set to a first inductance value, and variable capacitor 120 is set to a first capacitance value.

FIG. 4B is a block diagram of variable resistor-inductor-capacitor subsystem 401 according to one embodiment of the present invention, wherein variable resistor 320 is set to a second resistance value, variable inductor 230 is set to a second inductance value, and variable capacitor 120 is set to a second capacitance value.

FIG. 8A is a block diagram of a variable antenna subsystem 801 according to one embodiment of the present invention, wherein variable antenna 810 is set to a first length.

FIG. 8B is a block diagram of variable antenna subsystem 801 according to one embodiment of the present invention, wherein variable antenna 810 is set to a second length.

FIG. 8C is a block diagram of a variable antenna array subsystem 802 according to one embodiment of the present invention, wherein variable antenna array 820 is set to a first spacing.

FIG. 8D is a block diagram of variable antenna array subsystem 802 according to one embodiment of the present invention, wherein variable antenna array 820 is set to a second spacing.

FIG. 8E is a block diagram of a variable antenna array subsystem 803 according to one embodiment of the present invention, wherein variable antenna array 830 is set to a first length.

FIG. 8F is a block diagram of variable antenna array subsystem 803 according to one embodiment of the present invention, wherein variable antenna array 830 is set to a second length.

FIG. 8G1 is a circuit diagram of antenna array subsystem 806 having one or more active-variable-antenna element subsystems 804 and/or one or more passive-variable-antenna element subsystems 805 according to one embodiment of the present invention (such as shown in FIG. 8G).

FIG. 8H is a block diagram of variable antenna array subsystem 807 according to one embodiment of the present invention, wherein variable antenna array 870 is set to a first dielectric configuration.

FIG. 8i is a block diagram of variable antenna array subsystem 807 according to one embodiment of the present invention, wherein variable antenna array 870 is set to a second dielectric configuration.

FIG. 8J is a block diagram of variable antenna array subsystem 808 having a reconfigurable dielectric fluid according to one embodiment of the present invention, wherein variable antenna array 880 is set to a first dielectric-fluid configuration.

FIG. 9 is a block diagram of feedback-controlled system 901 having one or more variable-RLC, antenna, robotics, gain, $\omega$, $\lambda$, $\phi$, and the like elements in a circuit 920, controlled by a feedback circuit 930 according to one embodiment of the present invention.

FIG. 10 is a flowchart of a method 1000 according to some embodiments of the invention.

DESCRIPTION OF PREFERRED EMBODIMENTS

Figure 2I:
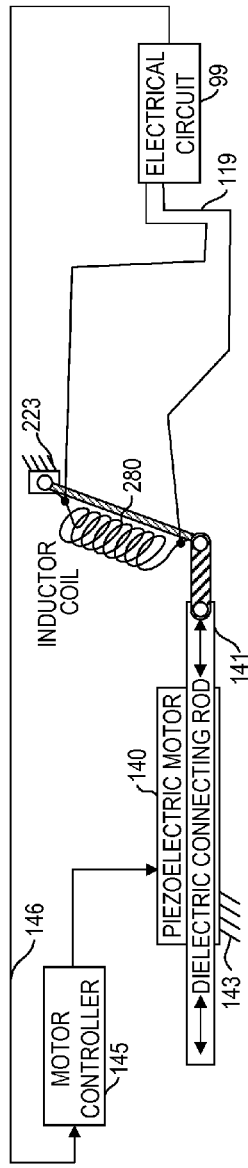
FIG. 2i is a block diagram of a variable-position inductor subsystem 208 according to one embodiment of the present invention, wherein variable-position inductor 280 is set to a first position.

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

FIG. 1A is a block diagram of a variable capacitor subsystem 101 having a variable capacitor 110 according to one embodiment of the present invention. In some embodiments, variable capacitor system 101 controls variable capacitor 110, which includes a first plate 111 and a second plate 112 that together form a capacitor having a capacitance substantially proportional to the overlapping area A between the plates and inversely proportional to the distance d between the plates (and also dependent on the permittivity $\in$ of any material between the plates). In some embodiments, plate 112 is substantially parallel to plate 111 (such that $C=\in A/d$ where in a vacuum, $\in_0 = 8.85$ pF/m, which is approximately the same permittivity as in air). In the embodiment shown, a non-magnetic mechanical movement device (e.g., motor or pump) 140 is used to vary the distance d between the plates. In some embodiments, plate 111 is affixed to a fixed location 113, while the other plate 112 is connected to a movable connecting rod 141, which is moved to a desired position by motor 140 (in some embodiments, a linear motor, and in some such embodiments, a piezoelectric motor 140) under the control of motor controller 145. In some embodiments, a feedback signal 146 is used by motor controller 145 to control the position. In some embodiments, electrical circuit 99 uses the variable capacitor 110 as part of its circuitry (e.g., to set a frequency, phase, gain/attenuation, temporal properties, spatial properties (the shape of magnetic or electric fields), pulse width or other capacitance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 113. In some embodiments, connecting rod 141 is connected to movable plate 112 using a mechanically advantaged linkage such as a lever (e.g., such as shown in FIG. 4A and FIG. 4B below).

In some embodiments, electric circuit 99 (as shown in any of the figures herein) includes a detector that measures or senses one or more parameters (such as capacitance, complex impedance (such as the real and imaginary components of impedance or the magnitude and phase angle), frequency, voltage-standing-wave ratio (VSWR) or other suitable parameter), and automatically adjusts the parameter (e.g., capacitance) value of the adjustable component (e.g., variable capacitor 110) to obtain a desired value(s) for the parameter(s). In some embodiments, the adjustment is part of a feedback loop (e.g., to stabilize, maximize or minimize a signal) in an analog circuit.

In some embodiments, circuit 99 is connected to the variable component by a transmission line 119 having a characteristic impedance. In some embodiments, the variable capacitor subsystem 101 is adjusted such that the impedance of circuit 99 at its connection to transmission line 119 is matched to the characteristic impedance of transmission line 119, and such that the variable component (e.g., variable capacitor 110 and the other components or effective equivalent resistance, inductance and capacitance) have matched impedances. For example, in some embodiments, the circuit 99 includes a transmitter having an output impedance of 50 ohms, the transmission line 119 has a characteristic impedance of 50 ohms, and at the frequency of interest, capacitor 110 (and any antenna or other elements or parasitic resistance-inductance-capacitance) has a characteristic impedance of 50 ohms. Of course the characteristic impedance can have other values in other embodiments.

In some embodiments, the parameter adjustment is programmable and a suitable computer program uses computer-readable instructions from a computer-readable medium to control a method that automatically adjusts the parameter value.

In some embodiments, a plurality of adjustable non-magnetic components, such as that shown in FIG. 1A and/or any of the other Figures herein, are combined in a single system, and the parameter(s) of each are iteratively adjusted (i.e., the first component is adjusted, then the second component (and optionally further components) are then adjusted in sequence (or optionally two or more are simultaneously adjusted), then the first component is again adjusted, then the second component (and optionally further components) are then again adjusted (or optionally two or more are again simultaneously adjusted) in an iterative sequence) in order to obtain an improved or optimum characteristic (such as frequency response, distance, range, direction of a transmitted or received radio signal and/or other like parameters to obtain a desired result (such as image quality)).

FIG. 1B is a block diagram of a variable capacitor system 102 having variable capacitor 120 according to one embodiment of the present invention, wherein variable capacitor 120 is set to a first capacitance value. In some embodiments, variable capacitor 120 includes a first set of parallel plates 121 and a second set of parallel plates 122 that together form a capacitor having a capacitance substantially proportional to the overlapping area A between the plates and inversely proportional to the distance d between the plates (and also dependent on the permittivity $\in$ of any material between the plates). In some embodiments, the horizontal plates of set of parallel plates 122 is interleaved substantially parallel to the horizontal plates of set of parallel plates 121 (such that $C=\in A/d$ where in a vacuum, $\in_0=8.85$ pF/m, which is approximately the same permittivity as in air). In the embodiment shown, motor 140 is used to vary the area A overlapped between the plates. In some embodiments, the set of parallel plates 121 is affixed to a fixed location 113, while the other set of parallel plates 122 is connected to a movable connecting rod 141, which is moved to a desired position by motor 140 (in some embodiments, a linear motor, and in some such embodiments, a piezoelectric motor 140) under the control of motor controller 145. In some embodiments, a feedback signal 146 is used by motor controller 145 to control the position. In some embodiments, electrical circuit 99 uses the variable capacitor 120 as part of its circuitry (e.g., to set a frequency or pulse width or other capacitance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 113. In some embodiments, connecting rod 141 is connected to movable set of parallel plates 122 using a mechanically advantaged linkage such as a lever (e.g., such as shown in FIG. 4A and FIG. 4B below). In some embodiments, the mechanical linkage is configured to produce a non-linear change in capacitance per change in position of rod 141 (in some embodiments, the capacitance per unit rod movement is a function of position (such as to produce a logarithmic capacitance scale). In some embodiments, motor controller 145 produces a non-linear relationship between a value of signal 146 and the capacitance obtained by moving rod 141 according to some predetermined function, equation, or look-up table. In the configuration shown in FIG. 1B, the value of the capacitance is relatively low due to the small amount of overlapped area between set of parallel plates 121 and set of parallel plates 122.

FIG. 1C is a block diagram of variable capacitor system 102 as was shown in FIG. 1B, but wherein variable capacitor 120 is set to a second capacitance value. In the configuration shown in FIG. 1B, the value of the capacitance is relatively high due to the large amount of overlapped area between set of parallel plates 121 and set of parallel plates 122.

FIG. 1D is a block diagram of a variable capacitor system 103 having a variable capacitor 130 according to one embodiment of the present invention, wherein variable capacitor 130 is set to a first capacitance value. In some embodiments, connecting rod 141 moves a block or sheet of dielectric material 133 (e.g., in some embodiments, a high-K dielectric material (i.e., a dielectric material having a high dielectric constant, K)) by a variable amount into or out of the air space separating the plates 132 and 131 of variable capacitor 130. The varied area of high-K dielectric material 133 located between the plates 132 and 131 based on the position of connecting rod 141 and the varied remaining area between the plates 132 and 131 that does not have the high-K dielectric material 133 thus varies the effective overall or distributed dielectric constant between the plates, thus varying the capacitance. In some embodiments, the block or sheet of dielectric material 133 has a variable thickness, such that in a first position of connecting rod 141 a first thickness of dielectric material 133 is between the plates 131 and 132 and in a second position of connecting rod 141 a second thickness of dielectric material 133 is between the plates 131 and 132, thus varying the capacitance of variable capacitor 130. In some embodiments, dielectric material 133 is ramp shaped (having a longitudinal cross-section thickness that gradually increases in a straight or curved ramp from one end to the other), stepped (having a longitudinal cross-section thickness that increases in one or more steps from one end to the other), or is convex, concave or otherwise curved (having a longitudinal cross-section thickness that increases and then decreases from one end to the other, or that decreases and then increases from one end to the other, or that has some other desired shape). In other embodiments, numerous other thickness or area-shape or dielectric variations are used for dielectric material 133.

FIG. 2A is a block diagram of a variable inductor subsystem 201 according to one embodiment of the present invention, wherein variable inductor 210 is set to a first inductance value. In some embodiments, variable inductor 210 includes a coil 221 having a plurality of N turns in a length l and a cross-sectional area of A (and also dependent on the permeability constant μ of any material within the field of the coil 221). In some embodiments, the inductance is substantially $L=(\mu N^2 A)/l$, where the value μ is dependent on the material, position and size of the core 222). In the embodiment shown, motor 140 is used to vary the position of the core 222 (which has a permeability or permittivity that affects inductance of the inductor or reactance of the entire structure), withdrawing it to reduce the inductance and inserting the core to increase the inductance. In some embodiments, coil 221 is affixed (e.g., at both ends) to a fixed mechanical location 223, while the core 222 is connected to a movable connecting rod 141, which is moved to a desired position by motor 140 (in some embodiments, a linear motor, and in some such embodiments, a piezoelectric motor 140) under the control of motor controller 145. (Of course, other embodiments may choose to attach the coil 221 to the connecting rod 141 and to attach the core 222 to a fixed location.) In some embodiments, a feedback signal 146 is used by motor controller 145 to control the position. In some embodiments, electrical circuit 99 uses the variable inductor 210 as part of its circuitry (e.g., to set a frequency or pulse width or other inductance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 223. In some embodiments, connecting rod 141 is connected to core 222 using a mechanically advantaged linkage such as a lever (e.g., such as shown in FIG. 4A and FIG. 4B below). In some embodiments, motor controller 145 produces a non-linear relationship between a value of signal 146 and the inductance obtained by moving rod 141 according to some predetermined function, equation, or look-up table. In the configuration shown in FIG. 2A, the value of the inductance is relatively low (i.e., lower than when the core is in the position shown in FIG. 2B) due to the small amount of overlapped length between coil 221 and core 222.

FIG. 2B is a block diagram of variable inductor subsystem 201, wherein variable inductor 210 is set to a second inductance value. In the configuration shown in FIG. 2B, the value of the inductance is relatively high (i.e., higher than when the core is in the position shown in FIG. 2A) due to the large amount of overlapped length between coil 221 and core 222.

FIG. 2C is a block diagram of a variable inductor subsystem 203 according to one embodiment of the present invention, wherein variable inductor 230 is set to a first inductance value. In some embodiments, variable inductor 230 includes a coil 224 having a plurality of N turns in a length l and a cross-sectional area of A (and also dependent on the permeability constant $\mu$ of any material within the field of the coil 221). In some embodiments, the inductance is substantially $L=(\mu_0 N^2 A)/l$, where the value $\mu_0=4\pi \times 10^{-7}$ H/m is permeability of free space, which substantially equals that of air). In the embodiment shown, motor 140 is used to vary the length of coil 224. In some embodiments, one end of coil 224 is affixed (e.g., at only one end) to a fixed location 223, while the other end of coil 224 is connected to a movable connecting rod 141, which is moved to a desired position by motor 140 (in some embodiments, a linear motor, and in some such embodiments, a piezoelectric motor 140) under the control of motor controller 145. In some embodiments, the coil 224 is wrapped on an elastomeric support core (or one side of each turn is connected to an elastomeric support substrate), such that the spacings between turns remains proportional to the length l of the coil 224. In some embodiments, a feedback signal 146 is used by motor controller 145 to control the position. In some embodiments, electrical circuit 99 uses the variable inductor 230 as part of its circuitry (e.g., to set a frequency or pulse width or other inductance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 223. In some embodiments, connecting rod 141 is connected to the movable end of coil 224 using a mechanically advantaged linkage such as a lever (e.g., such as shown in FIG. 4A and FIG. 4B below). In some embodiments, motor controller 145 produces a non-linear relationship between a value of signal 146 and the inductance obtained by moving rod 141 according to some predetermined function, equation, or look-up table. In the configuration shown in FIG. 2C, the value of the inductance is relatively low (i.e., lower than when the inductor 230 is closely spaced as in the position shown in FIG. 2D) due to the extended length of coil 224 and thus the smaller amount of flux linkage through each turn.

FIG. 2D is a block diagram of variable inductor subsystem 203 according to one embodiment of the present invention, wherein variable inductor 230 is set to a second inductance value. In the configuration shown in FIG. 2D, the value of the inductance is relatively high (i.e., higher than when the inductor 230 is spread out as in the position shown in FIG. 2C) due to the shortened length of coil 224 and thus the larger amount of flux linkage through each turn.

FIG. 2E is a block diagram of a variable inductor subsystem 205 according to one embodiment of the present invention, wherein variable inductor 250 is set to a first inductance value. In some such embodiments, the number of loops of coil 251 is varied (e.g., by using a sliding contactor 257 that makes an electrical connection to different loops of coil 251 as connecting rod 141 is moved by motor 140). In the present position of connecting rod 141 shown in FIG. 2E, about eight (8) loops are between connector 257 at the left end of the coil 251 and the electrical connection 256 at the right end of coil 251 next to its mechanical connection at fixed mechanical location 223. In some embodiments, the left end of the coil 251 is mechanically connected to fixed location 227, and in some such embodiments, the left end of the coil 251 also has an electrical connection 258 (e.g., to an electrical ground), and in the present position of connecting rod 141 shown in FIG. 2E about one-half (0.5) loop is between connector 257 near the left end of the coil 251 and the electrical connection 258 (e.g., to ground) at the far left end of coil 251 next to its mechanical connection at fixed mechanical location 227. Note that in some embodiments, electrical connection 258 is omitted and a single set of loops of coil 251 are in the circuit (between connection 257 and connection 256 connected to electrical circuit 99, while in other embodiments, electrical connection 258 is included (e.g., connected to ground or some other node in circuit 99) and two coupled sets of loops of coil 251 are in the circuit (a first set of loops between connection 257 and connection 256 connected to electrical circuit 99, and a second set of loops between connection 257 and connection 258 connected to ground or some other node in electrical circuit 99).

FIG. 2F is a block diagram of variable inductor subsystem 205 according to one embodiment of the present invention, wherein variable inductor 250 is set to a second inductance value. This system is substantially the same as that shown in FIG. 2E, except that the connecting rod 141 is in a different position that changes the inductance value(s) due to the different number of loops of the coil as determined by wiper 257. In the alternate position of connecting rod 141 shown in FIG. 2F, about four (4) loops are between connector 257 near the middle of the coil 251 and the electrical connection 256 at the right end of coil 251 next to its mechanical connection at fixed mechanical location 223. In some embodiments, the left end of the coil 251 is mechanically connected to fixed location 227, and in some such embodiments, the left end of the coil 251 also has an electrical connection 258 (e.g., to an electrical ground), and in the alternate position of connecting rod 141 shown in FIG. 2F about four-and-a-half (4.5) loops are between connector 257 near the middle of the coil 251 and the electrical connection 258 (e.g., to ground) at the far left end of coil 251 next to its mechanical connection at fixed mechanical location 227. Thus, in some embodiments, a variable differential coil 250 is provided.

FIG. 2G is a block diagram of a variable inductor subsystem 207 according to one embodiment of the present invention, wherein variable inductor 270 is set to a first inductance value and a first spatial orientation (e.g., elongated left-to-right in FIG. 2G). By varying the position of coil-squeezing bar 272, the shape of the loops of coil 271 can be varied (e.g., from elongate left-to-right, to circular, and to elongate up-to-down), which varies both the inductance and the spatial shape of the magnetic field that is transmitted if a transmitted signal is sent to the coil 271 from circuit 99, and/or the magnetic field that is detected if the signal from the coil 271 is received by the electrical circuit 99. In some embodiments, the coil 99 is used simultaneously to both transmit and receive an AC magnetic signal, wherein the magnitude and phase angle of the received signal is detected by applying the transmitted signal through a known impedance (such as a resistor) and then subtracting the signal at the coil from the original transmitted signal and subtracting the signal at the coil from a quadrature phase version of the transmitted signal, and then multiplying the two difference values by each other, as is well known in the art (e.g., see U.S. Pat. No. 6,636,037 and U.S. Pat. No. 6,002,251, both of which are incorporated herein by reference).

FIG. 2H is a block diagram of variable inductor subsystem 207 according to one embodiment of the present invention, wherein variable inductor 270 is set to a second inductance value and a second spatial orientation (e.g., elongated up-to-down in FIG. 2G). In some embodiments, the second inductance (from FIG. 2H) is the same as the first inductance (from FIG. 2G), but the spatial shape and/or direction of the magnetic field has been changed. In other embodiments, both the inductance and the spatial shape are varied.

FIG. 2i is a block diagram of a variable-position inductor subsystem 208 according to one embodiment of the present invention, wherein variable-position inductor 280 is set to a first position (e.g., such that the direction of the AC magnetic is upper-right-to-lower-left in FIG. 2i). In some embodiments, the second inductance (from FIG. 2J) is the same as the first inductance (from FIG. 2i), but the spatial direction of the magnetic field has been changed.

Figure 2J:
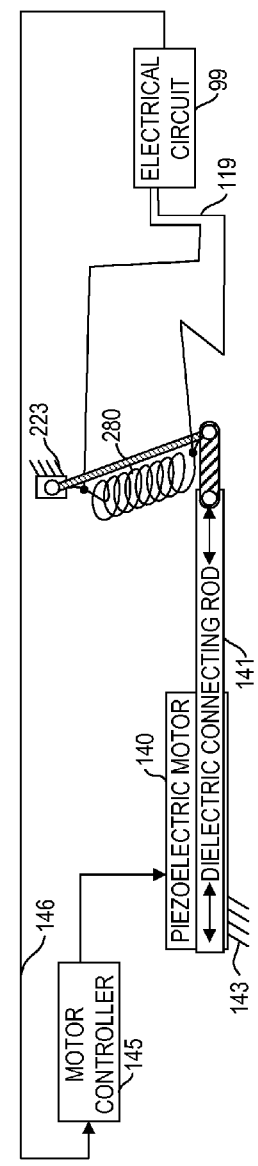
FIG. 2J is a block diagram of variable-position inductor subsystem 208 according to one embodiment of the present invention, wherein variable-position inductor 280 is set to a second position.

FIG. 2J is a block diagram of variable-position inductor subsystem 208 according to one embodiment of the present invention, wherein variable-position inductor 280 is set to a second position (e.g., such that the direction of the AC magnetic is upper-left-to-lower-right in FIG. 2i). In some embodiments, the second inductance (from FIG. 2J) is the same as the first inductance (from FIG. 2i), but the spatial direction of the magnetic field has been varied.

Figure 2K:
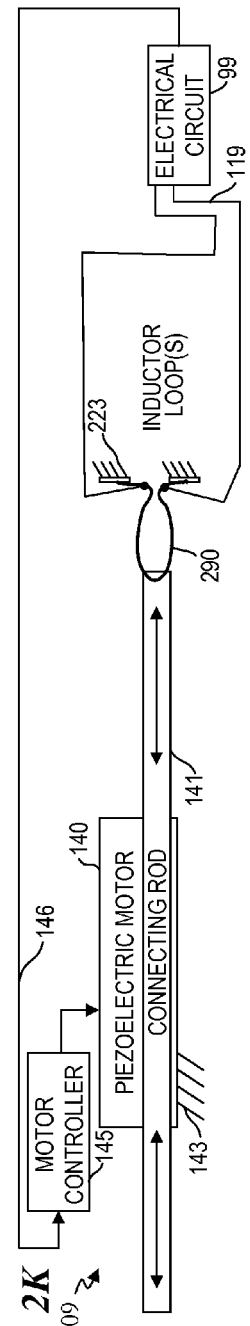
FIG. 2K is a block diagram of a variable-shape inductor subsystem 209 according to one embodiment of the present invention, wherein variable-shape inductor 290 is set to a first shape.

FIG. 2K is a block diagram of a variable-shape inductor subsystem 209 according to one embodiment of the present invention, wherein variable-shape inductor 290 is set to a first shape. This configuration is substantially similar to that of FIG. 2G, except that the number of loops of coil 290 is just one in some embodiments.

Figure 2L:
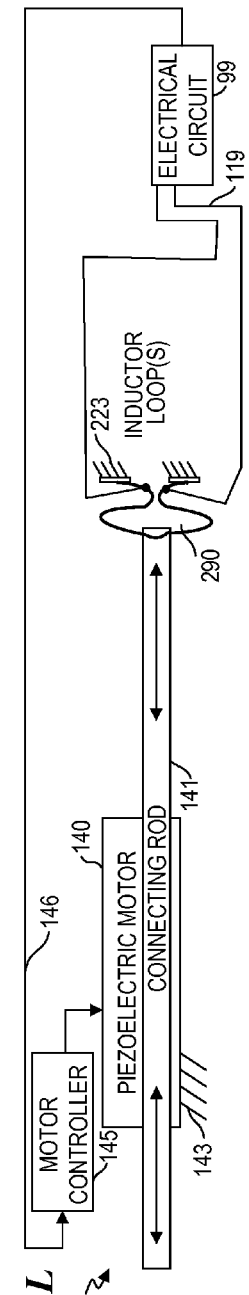
FIG. 2L is a block diagram of variable-shape inductor subsystem 209 according to one embodiment of the present invention, wherein variable-shape inductor 290 is set to a second shape.

FIG. 2L is a block diagram of variable-shape inductor subsystem 209 according to one embodiment of the present invention, wherein variable-shape inductor 290 is set to a second shape. This configuration is substantially similar to that of FIG. 2H, except that the number of loops of coil 290 is just one in some embodiments. In some embodiments, the second inductance (from FIG. 2L) is the same as the first inductance (from FIG. 2K), but the spatial shape and/or direction of the magnetic field has been changed. In other embodiments, both the inductance and the spatial shape are varied.

FIG. 3A is a block diagram of a variable resistor subsystem 301 according to one embodiment of the present invention, wherein variable resistor 320 is set to a first resistance value. In some embodiments, variable resistor 320 includes a resistive element 321 having a resistance r per unit length, and a conductive wiper 322 configured to move along the length of and to contact resistive element 321 at a plurality of locations. In some embodiments, the wiping motion provides a smoothly continuous plurality of locations for the location of contact and the length l for the resistor, and thus a smoothly continuous plurality of resistances. In some embodiments, the resistance between wiper 322 and the left end 324 is substantially $R=rl$, where the length l is dependent on the position of wiper 322 relative to the left end, and the resistance between wiper 322 and the left end 324 is substantially $R=r(L-l)$ where L is the entire resistance length between left end electrical contact 324 and right end electrical contact 325. In some embodiments, the resistance per unit length is a function of position (such as to produce a logarithmic resistance scale). In the embodiment shown, motor 140 is used to vary the position of the wiper 322, moving it left to decrease the resistance to the left end and increase the resistance to the right end, while conversely moving it right to increase the resistance to the left end and decrease the resistance to the right end. In some embodiments, resistive element 321 is affixed (e.g., at both ends) to a fixed location 323, while the wiper 322 is connected to a movable connecting rod 141, which is moved to a desired position by motor 140 (in some embodiments, a linear motor, and in some such embodiments, a piezoelectric motor 140) under the control of motor controller 145. In some embodiments, a feedback signal 146 is used by motor controller 145 to control the position. (Of course, other embodiments may choose to attach the resistive element 321 to the connecting rod 141 making the resistive element 321 movable, and to attach the wiper 322 to a fixed location.) In some embodiments, electrical circuit 99 uses the variable resistor 320 as part of its circuitry (e.g., to set a frequency or pulse width, to control a gain, or other resistance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 323. In some embodiments, connecting rod 141 is connected to wiper 322 using a mechanically advantaged linkage such as a lever (e.g., such as shown for the variable inductor or variable capacitor in FIG. 4A and FIG. 4B below). In some embodiments, motor controller 145 produces a non-linear relationship between a value of signal 146 and the resistance obtained by moving rod 141 according to some predetermined function, equation, or look-up table. In the configuration shown in FIG. 3A, the value of the resistance between wiper 322 and left end 324 is relatively low due to the small resistance length between wiper 322 and left end 324, while the value of the resistance between wiper 322 and right end 325 is relatively high due to the larger resistance length between wiper 322 and right end 325. Thus, in some embodiments, variable resistor 320 forms a three-connection (i.e., connections 322, 324 and 325) potentiometer. In other embodiments, only two connections (e.g., connections 322 and 325) are used.

FIG. 3B is a block diagram of variable resistor subsystem 301 according to one embodiment of the present invention, wherein variable resistor 320 is set to a second resistance value. In the configuration shown in FIG. 3B, the value of the resistance between wiper 322 and left end 324 is relatively high due to the larger resistance length between wiper 322 and left end 324, while the value of the resistance between wiper 322 and right end 325 is relatively low due to the smaller resistance length between wiper 322 and right end 325.

FIG. 3C is a block diagram of a variable resistor subsystem 303 according to one embodiment of the present invention, wherein variable resistor 330 is set to a first resistance value. In some embodiments, variable resistor 330 includes an elasto-resistive element 331 having a resistance R that varies as the length of elasto-resistive element 331 is stretched or compressed, and which provides a smoothly continuous plurality of resistances, or a substantially-off/substantially-on switch behavior. In some embodiments, elasto-resistive element 331 is made of non-magnetic materials in order to avoid being affected by high magnetic fields. In some embodiments, an elastomeric material such as described in U.S. Pat.

No. 6,495,069 that issued Dec. 17, 2002 to Lussey et al. titled "POLYMER COMPOSITION," which is incorporated herein by reference. In the embodiment shown, motor 140 is used to move connecting rod 141 to vary the length of (or vary the compression on) elasto-resistive element 331, moving it left to increase the resistance to the right end, while conversely moving it right to decrease the resistance to the right end. In some embodiments, one end of elasto-resistive element 331 is affixed (e.g., at its right-hand end) to a fixed location 323, while the other end of elasto-resistive element 331 is connected to a movable connecting rod 141, which is moved to a desired position by motor 140 (in some embodiments, a linear motor, and in some such embodiments, a piezoelectric motor 140) under the control of motor controller 145. In some embodiments, a feedback signal 146 is used by motor controller 145 to control the position. In some embodiments, electrical circuit 99 uses the variable resistor 330 as part of its circuitry (e.g., to set a frequency or pulse width, to control a gain, or other resistance-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to location 323. In some embodiments, connecting rod 141 is connected to the movable end of elasto-resistive element 331 using a mechanically advantaged linkage such as a lever (e.g., such as shown for the variable inductor or variable capacitor in FIG. 4A and FIG. 4B below). In some embodiments, motor controller 145 produces a non-linear relationship between a value of signal 146 and the resistance obtained by moving rod 141 according to some predetermined function, equation, or look-up table. In the configuration shown in FIG. 3C, the value of the resistance between the movable left end 326 and the fixed right end 325 is relatively high due to stretching of (or lack of compression on) elasto-resistive element 331.

FIG. 3D is a block diagram of variable resistor 303 according to one embodiment of the present invention, wherein variable resistor 330 is set to a second resistance value. In the configuration shown in FIG. 3D, the value of the resistance between the movable left end 326 and the fixed right end 325 is relatively low due to non-stretching of (or the compression on) elasto-resistive element 331.

FIG. 4A is a block diagram of a variable resistor-inductor-capacitor device 401 according to one embodiment of the present invention, wherein variable resistor 320 is set to a first resistance value, variable inductor 230 is set to a first inductance value, and variable capacitor 120 is set to a first capacitance value. In some embodiments, a single piezoelectric motor 140 is linked to simultaneously control a plurality of variable elements as shown in FIG. 4A and FIG. 4B (which may provide lower cost and a smaller less-massive footprint), while in other embodiments, separate piezoelectric motors 140 are used to control each of a plurality of individual RLC and/or antenna element separately (as shown in FIGS. 1A-3D described above and FIGS. 8A-8M described below)) (which may have a high cost and a larger more-massive footprint, but provides greater programmability and individual adjustments of the various parameters). In some embodiments, device 401 includes a lever arm 449 connected to a fixed position at a pivot point 448. In some embodiments, a plurality of connecting arms 445 are attached to one or more leverage points on level arm 449, in order that the movement of motor connecting rod 141 can provide different amounts of movement to each of a plurality of variable electrical components, such as capacitor 120, inductor 230 and resistor 320. In the embodiment shown, capacitor 120 is provided the greatest movement per unit of motion of motor connecting rod 141, inductor 230 a middle amount of movement per unit of motion of motor connecting rod 141 and resistor 320 (in this case, directly connected to motor connecting rod 141) the least amount of movement per unit of motion of motor connecting rod 141. Note also that some components can be attached to receive a compression motion using the same movement of motor connecting rod 141 that provides an expansion motion to other elements (note capacitor 120 is compressed (increasing capacitance) while inductor 230 is extended (decreasing inductance) when motor connecting rod 141 moves left, and capacitor 120 is extended (decreasing capacitance) while inductor 230 is compressed (increasing inductance) when motor connecting rod 141 moves right). Further, the proportions of change can be varied using simple levers or by using more complex mechanical embodiments such as four-arm devices and the like.

In the embodiment shown, motor 140 is used to vary the position of the wiper 322 to vary the resistance, to change the amount of area of capacitor 120 to vary the capacitance, and to stretch or compress coil 230 to vary the inductance, each via a single movable connecting rod 141, which is moved to a desired position by motor 140 (in some embodiments, a linear motor, and in some such embodiments, a piezoelectric motor 140) under the control of motor controller 145. In some embodiments, a feedback signal 146 is used by motor controller 145 to control the position. In some embodiments, electrical circuit 99 uses the variable resistor 320, variable inductor 230 and variable capacitor 120 as part of an RLC (resistive-inductive-capacitive) part of its circuitry (e.g., to set a frequency or pulse width, change a Q (quality) factor, to control a gain, or other RLC-controlled parameter). In some embodiments, electrical circuit 99 generates feedback signal 146 (e.g., as negative feedback to stabilize the circuit at a given set of parameters). In some embodiments, motor 140 is also affixed to a set location 143 relative to fixed locations 323 and 447. In some embodiments, connecting rod 141 is connected to wiper 322 also using a mechanically advantaged linkage such as lever 449. In some embodiments, motor controller 145 produces a non-linear relationship between a value of signal 146 and the position of moving rod 141 according to some predetermined function, equation, or look-up table. In the position configuration shown in FIG. 4A, the value of the resistance between wiper 322 and left end 324 is relatively low, while the value of the resistance between wiper 322 and right end 325 is relatively high, the value of the inductance is relatively low and the value of the capacitance is relatively high.

FIG. 4B is a block diagram of variable resistor-inductor-capacitor 401 according to one embodiment of the present invention, wherein variable resistor 320 is set to a second resistance value, variable inductor 230 is set to a second inductance value, and variable capacitor 120 is set to a second capacitance value. In the position configuration shown in FIG. 4A, the value of the resistance between wiper 322 and left end 324 is relatively high, while the value of the resistance between wiper 322 and right end 325 is relatively low, the value of the inductance is relatively high and the value of the capacitance is relatively low.

Figure 5:
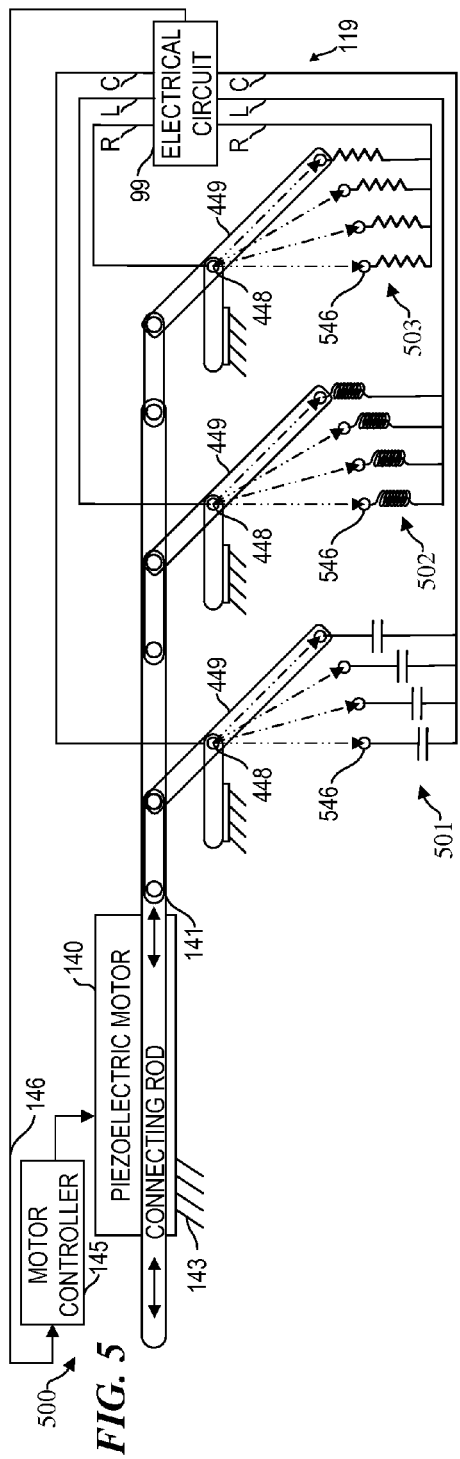
FIG. 5 is a block diagram of a variable resistor-inductor-capacitor subsystem 500 according to one embodiment of the present invention, wherein variable resistor 503 is set to a first resistance value, variable inductor 502 is set to a first inductance value, and variable capacitor 501 is set to a first capacitance value.

FIG. 5 is a block diagram of a variable resistor-inductor-capacitor 500 according to one embodiment of the present invention, wherein variable resistor 503 is set to a first resistance value, variable inductor 502 is set to a first inductance value, and variable capacitor 501 is set to a first capacitance value. In some embodiments, one or more of the variable resistor-inductor-capacitor components 500 are switched to a plurality of discrete values using switches 546 that are controlled by the motion of connecting rod 141 as it is moved by motor 140 as described above. In some embodiments (not shown here), each switch 546 is an elastomeric switch (such as described in U.S. Pat. No. 6,495,069 issued Dec. 17, 2002 to Lussey et al. which is incorporated herein by reference) that avoids transients and sparking by compressing the granule-filled polymer using the mechanical pressure of the end of lever arm 449 against the polymer material to make the connection to one or another of the capacitor, inductor, and/or resistors that can thus be selectively switched in or out to circuit 99. In some embodiments, the switched components includes a switch between an open (infinite resistance) and a short (zero resistance), or a switch that variously connects different nodes in circuit 99. In some embodiments, the switched components includes a switch that connects different antenna elements to circuit 99, or selectively switches between two or more antenna elements connected to one another or disconnected from one another.

Figure 6:
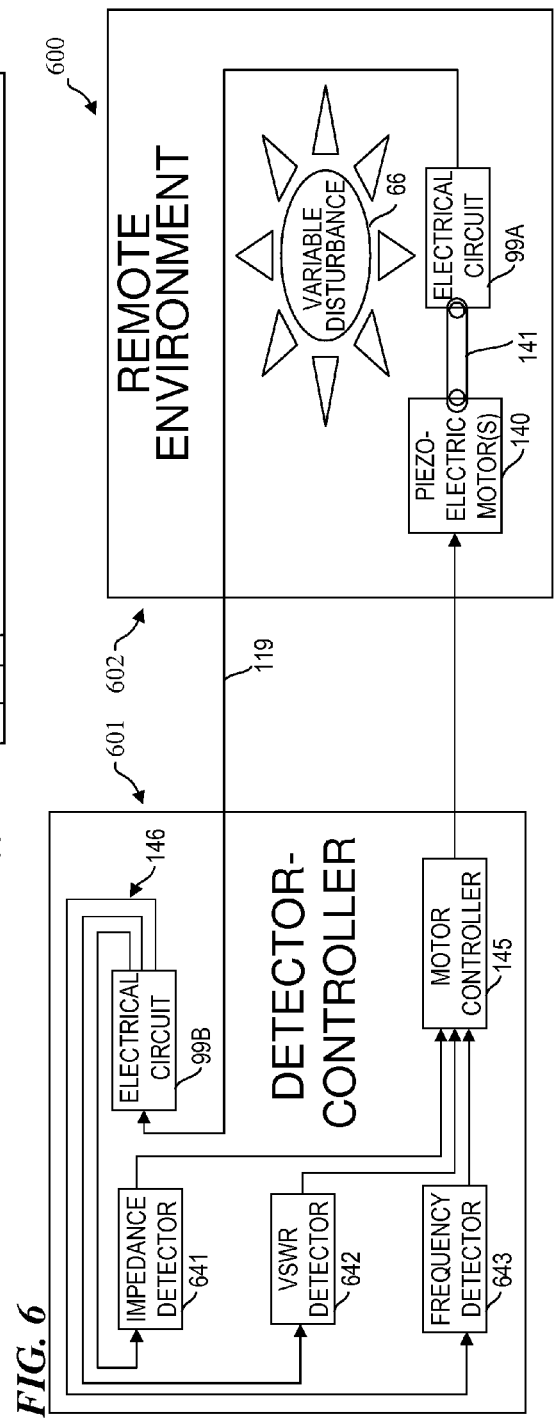
FIG. 6 is a block diagram of an entire system 600 according to one embodiment of the present invention, wherein variable electrical components of circuits 99A and/or 99B are controlled to parameters set by controller 601.

FIG. 6 is a block diagram of an entire system 600 according to one embodiment of the present invention, wherein variable electrical components of circuits 99A and/or 99B (particularly those in the portion labeled 99A in a remote environment 602) are controlled to values set by controller 601. In some embodiments, circuit 99 has two portions, a first portion 99A that is remote from a second portion 99B. In some embodiments, circuit portion 99A is coupled to circuit portion 99B by a transmission line 119 (having a characteristic impedance Z at a given operating frequency or spectrum) such as a coaxial cable. In some embodiments, controller 601 is well outside of the remote environment 602 (such as a high magnetic field enclosure, or a broadcast television antenna on a tower, or a remote weather sensor) that includes circuit portion 99A and its RLC components controlled by piezo motor 140 and/or its controller rod 141. In other embodiments, both portions 99A and 99B of circuit 99 (not explicitly labeled as such, but which includes both circuit portions 99A and 99B) are in a remote location. In some embodiments, electrical circuit 99B includes a transmitter, a receiver, or both.

One use of the present invention is to balance an RLC circuit wherein the inductance and/or capacitance parameters of at least a portion of the RLC circuit is affected by an external and variable disturbance 66 such as weather conditions or a conductive and/or dielectric body (e.g., such as when the frequency and/or impedance in relation to a transmission-line-signal connection of the circuit must be maintained for optimal performance, but the environment changes over time), wherein the variable disturbance 66 must be accommodated by changing the variable inductor and/or the variable capacitor. Accordingly, in some embodiments, an impedance-mismatch detector 641 and/or a voltage-standing-wave-ratio (VSWR) detector 642 are used to determine whether and how to modify the values of the inductance and capacitance in order to rebalance the impedance. For example, if circuit portion 99A has a characteristic impedance $Z_0$, transmission line 641 has the same characteristic impedance $Z_0$, and circuit portion 99B has the same characteristic impedance $Z_0$, then the circuit would be considered balanced. In some embodiments, the characteristic RLC values also determine a characteristic frequency $F_0$ or characteristic $Q_0$ (the quality of a resonant circuit). If then the variable disturbance 66 modifies the characteristic impedance of circuit portion 99A to a changed characteristic impedance $Z_0+\Delta Z$, then impedance-mismatch detector 641 and/or a voltage-standing-wave-ratio detector 642 would detect the change, and they send signal(s) to motor controller 145, which causes motor 140 to modify the variable portion(s) of capacitance and/or inductance to rebalance the impedances of each portion. If then the variable disturbance 66 changes and modifies the characteristic frequency $F_0$ or characteristic $Q_0$ of circuit portion 99A (by changing an RLC parameter) combined with circuit portion 99B to a changed characteristic frequency $F_0+\Delta F$ or characteristic $Q_0+\Delta Q$, then frequency detector 643 and/or a Q detector (not shown) would detect the change, and they send signal(s) to motor controller 145, which causes motor 140 to modify the variable portion(s) of capacitance and/or inductance to reset the frequency and/or Q of each portion.

In some embodiments, each of the components within remote environment 602 is made of materials that do not contain combinations of iron, nickel, cobalt, or the like that may be moved (physically displaced) by the high field, in order that the high field does not move these components.

In some embodiments, all or the relevant components are in a single location, and the present invention is used to adjust component parameters to compensate for some environmental change or a change in the physical surroundings of the circuit that affected any of the RLC parameters. For example, the mere presence of a person or other modality (that might be used to tune some aspect of a circuit) might adversely affect a resistance, inductance or capacitance. In those cases, some embodiments of the invention facilitate the adjustment of the resistance, inductance or capacitance values without a person needing to be in the vicinity. As another example, some circuits may need to be tuned to have a certain resistance, inductance and capacitance in the presence of a person (where a person in the vicinity changes these parameters by their presence, or due to physical or physiological motion (e.g., breathing, heart beating, gastrointestinal movement, and the like) by the person), but the position, body composition and size of the person is unknown and must be compensated for, and some embodiments of the invention facilitate the adjustment of the resistance, inductance or capacitance values to automatically compensate for those characteristics of the person in the vicinity. In some embodiments, conventional magnet-based motors or electric-field based motors themselves would have an undesired effect on the resistance, inductance and capacitance of a sensitive circuit (or such motors could themselves be adversely affected by high magnetic or electric fields), so piezo-electric motors as described herein have the advantage of not interacting (or interacting very little) with the resistance, inductance and capacitance being adjusted.

Figure 7A:
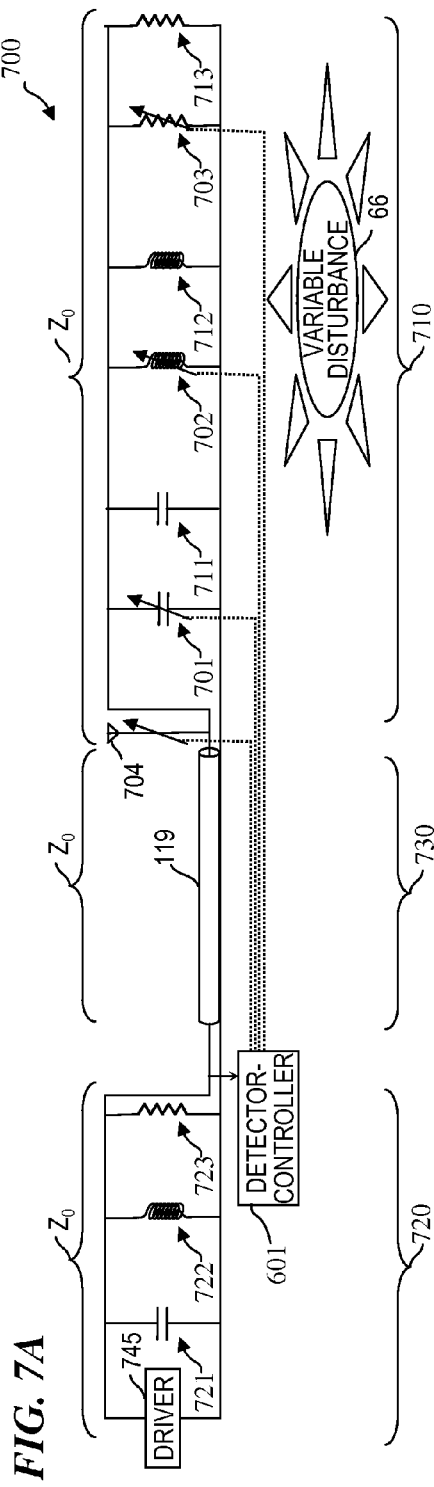
FIG. 7A is a block diagram of an impedance-matched high-frequency circuit 700 according to one embodiment of the present invention, and having an external impedance disturbance 66 having a first effect on circuit 700.

FIG. 7A is a block diagram of an impedance-matched high-frequency circuit 700 according to one embodiment of the present invention, and having an external impedance disturbance 66 having a first effect on circuit 700. In some embodiments, a driver circuit 720 has a characteristic impedance $Z_0$ composed of (or modeled by) an equivalent capacitance 721, equivalent inductance 722, equivalent resistance 723, and ideal voltage source driver 745 (which outputs a voltage signal having one or more frequency components and optionally a DC component, but is modeled as having a very high or infinite impedance such that its impedance does not affect the circuit). In other embodiments, ideal voltage source driver 745 is replaced by an ideal voltage sensor or transceiver (transmitter-receiver combination) (having a very high or infinite impedance such that its impedance does not affect the circuit). Of course, in other embodiments, the parallel connection of equivalent capacitance 721, equivalent inductance 722, equivalent resistance 723 and voltage source 745 can be replaced with a series-wired connection of a capacitance, inductance, resistance and an ideal current source (and/or ideal current detector, each having zero or negligible impedance) that can provide the same characteristic impedance $Z_0$. Driver circuit 720 is electrically coupled to a transmission line segment 730 (i.e., of transmission line 119 as shown in the other various Figures herein) also having the characteristic impedance $Z_0$ at the respective frequencies of interest in the signal, and transmission line segment 730 is in turn electrically coupled to a tuned circuit 710, which, in some embodiments, includes an equivalent capacitance (that includes a fixed capacitance component 711 and a variable capacitance component 701 that can be tuned as described above for FIG. 1A, FIG. 1B, FIG. 1C, and FIG. 1D), an equivalent inductance (that includes a fixed inductance component 712 and a variable inductance component 702 that can be tuned as described above for FIG. 2A, FIG. 2B, FIG. 2C, FIG. 2D, FIG. 2E, FIG. 2F, FIG. 2G, FIG. 2H, FIG. 2i, FIG. 2J, FIG. 2K, and FIG. 2L, as well as the inductance of the antenna elements in FIG. 8A, FIG. 8B, FIG. 8C, FIG. 8D, FIG. 8L and FIG. 8M), and an equivalent resistance (that includes a fixed resistance component 713 and a variable resistance component 703 that can be tuned as described above for FIG. 3A, FIG. 3B, FIG. 3C and FIG. 3D). In some embodiments, at least one variable antenna element 704 is optionally included (e.g., in some embodiments, coupled to the upper nodes of variable capacitor 701, variable inductor 702, and variable resistor 702, wherein the physical length, position and shape of one or more antenna elements are varied (such as described in FIGS. 8A-8M) under the control of detector-controller 601). In some embodiments, when in the presence of a variable disturbance 66 having a first characteristic (such as a piece of material, a person, or a weather situation), the capacitance, inductance and/or resistance of tuned circuit 710 are adjusted by varying the variable aspects of variable capacitance component 701, variable inductance component 702 and variable resistance component 703 using one or more sensing units (such as detectors 641, 642 and 643 of FIG. 6) and one or more motor controllers 145 and motors 140. In some embodiments, a detector-controller 601 (which may include circuit and/or microprocessor components, such as described above for FIG. 6) is coupled (e.g., in some embodiments, connected to transmission line 119) to measure electrical parameters of the signals (e.g., at the left end of transmission line 119), and based on the measurement(s), to control the variable parameters (e.g., resistance, inductance, capacitance, antenna length, resonant frequency, impedance at a given frequency, field shape, field direction, field spatial shape, field intensity, and like characteristics) in the remote tuned circuit 710.

Figure 7B:
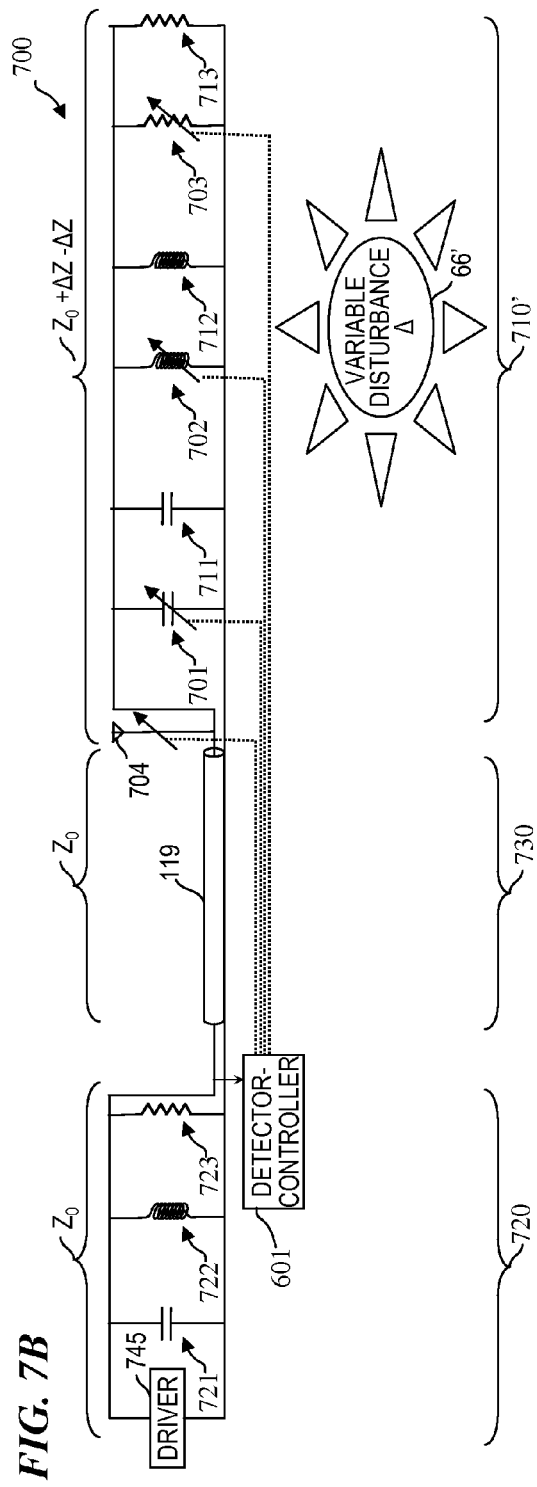
FIG. 7B is a block diagram of impedance-matched high-frequency circuit 700, and having a different external impedance disturbance 66' having a second effect on circuit 700.

FIG. 7B is a block diagram of impedance-matched high-frequency circuit 700, and having a different external impedance disturbance 66' having a second effect on circuit 700. In some embodiments, the present invention is used to adjust the RLC parameters of variable components 703, 702 and 701 in order to rebalance the circuit (in terms of characteristic impedance, frequency, Q, and/or other factor) in the presence of the changed external impedance disturbance 66'. In some embodiments, the present invention provides the capability to automatically adjust such parameters in the adjusted tuned circuit 710' "in real time" (i.e., quickly as the external impedance disturbance 66' changes over time).

FIG. 8A is a block diagram of a variable antenna subsystem 801 according to one embodiment of the present invention, wherein variable antenna 810 is set to a first length. In some embodiments, variable antenna 810 includes a plurality of slidingly connected conductor segments (e.g., concentric metal tubes or a central metal rod and a close-fitting metal sleeve) 812 and 815 (which, in some embodiments, are touching one another, and in other embodiments, are separated from one another by a dielectric material such as a TEFLON™ tube separator or air), such that when segment 812 is inserted further into segment 815, the antenna gets shorter, and thus the characteristic resonant frequency of antenna 810 goes up. In the configuration shown in FIG. 8A, the length of the antenna is resonant at a frequency that is relatively low (i.e., lower than when the conductive central 812 is in the position shown in FIG. 8B) due to the longer antenna because of the small amount of overlapped length between central conductor 812 and sleeve conductor 815.

FIG. 8B is a block diagram of variable antenna subsystem 801 according to one embodiment of the present invention, wherein variable antenna 810 is set to a second length (e.g., by conductive central segment 812 being pushed a distance into. In the configuration shown in FIG. 8B, the length of the antenna is resonant at a frequency that is relatively high (i.e., higher than when the conductive core 812 is in the position shown in FIG. 8A) due to the shorter antenna because of the larger amount of overlapped length between conductor 812 and conductor 815.

FIG. 8C is a block diagram of a variable antenna array subsystem 802 according to one embodiment of the present invention, wherein variable antenna array 820 is set to a first spacing. In some embodiments of the configuration shown in FIG. 8C, the phase difference of the signals at a given frequency between the various antenna segments 825 is relatively large (i.e., larger than when the antenna segments 825 are in the positions shown in FIG. 8D) due to the longer spaces between antenna segments 825. For example, for a phased-array antenna system, the varied phase differences between antenna segments 825 can be used to point the resulting radio beam in different directions. In other embodiments of the configuration shown in FIG. 8C, the frequency supported for a given (predetermined) phase difference between the various antenna segments 825 is relatively low (i.e., lower than when the antenna segments 825 are in the positions shown in FIG. 8D) due to the longer spaces between antenna segments 825.

FIG. 8D is a block diagram of variable antenna array subsystem 802 according to one embodiment of the present invention, wherein variable antenna array 820 is set to a second spacing. In some embodiments of the configuration shown in FIG. 8D, the phase difference of the signals at a given frequency between the various antenna segments 825 is relatively small (i.e., smaller than when the antenna segments 825 are in the positions shown in FIG. 8C) due to the shorter distances between antenna segments 825. In other embodiments of the configuration shown in FIG. 8C, the frequency supported for a given (predetermined) phase difference between the various antenna segments 825 is relatively high (i.e., higher than when the antenna segments 825 are in the positions shown in FIG. 8D) due to the shorter distances between antenna segments 825.

Figure 8G:
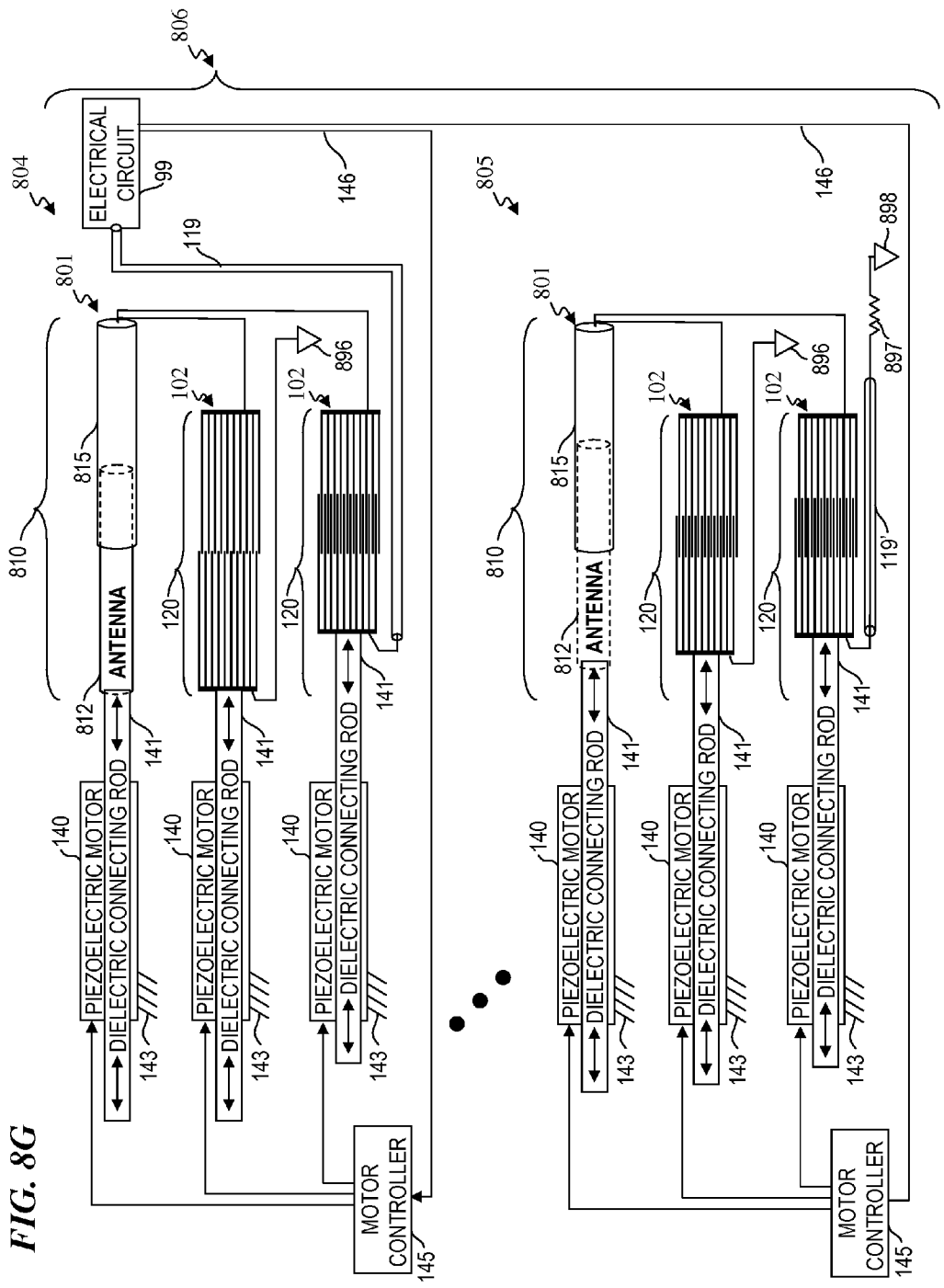
FIG. 8G is a block diagram of an antenna array subsystem 806 having one or more active-variable-antenna element subsystems 804 and/or one or more passive-variable-antenna element subsystems 805 according to one embodiment of the present invention, wherein active-variable-antenna element subsystems 804 is set to a first impedance-frequency value and passive-variable-antenna element subsystems 805 is set to a second impedance-frequency value.

FIG. 8E is a block diagram of a variable antenna array subsystem 803 according to one embodiment of the present invention, wherein variable antenna array 830 is set to a first length. In some embodiments, variable antenna array 830 includes a plurality of antenna elements 838 each having sliding segments 832 and 835 (e.g., concentric segments that slide one inside the other, or side-by-side wires clamped to one another) or extendable single elements such as described in FIG. 8L and FIG. 8M below. In some embodiments, a fixed base frame 223 holds one end of all the antenna elements and a movable frame 833 holds the opposite ends of all the antenna elements 838, wherein movable frame 833 is attached to connecting rod 141, which is controlled by motor 140, in order to simultaneously extend or shorten the lengths of a plurality of antenna elements 838 simultaneously. In some embodiments, each of a plurality of the antenna elements 838 is also individually adjustable in physical length such as described in FIG. 8A, FIG. 8B, FIG. 8C, FIG. 8D, FIG. 8L, and FIG. 8M, and/or adjustable in electrical length, resonant frequency, impedance and/or other characteristic (such as controlling the length(s), direction(s), strength, shape, and/or temporal changes of the radio-frequency electromagnetic field) such as described in FIG. 8G, FIG. 8H, FIG. 8i, FIG. 8J, and/or FIG. 8K. In some embodiments, a plurality of the antenna elements 838 are driven by a transmitted radio-frequency signal (for example, as shown in FIG. 8E, in some embodiments, the two antenna elements 838 that are labeled element 837 and element 839 are driven by two different phases of the same transmitted RF signal (e.g., the signal with zero phase shift can be applied to element 837 and the same signal but with a ninety-degree phase shift can be applied to element 839, wherein element 837 and element 839 are physically located ninety degrees from one another relative to a central (left-to-right) horizontal axis of antenna array 830; in other embodiments, other phase shifts and corresponding physical angular displacements can be used). In some such embodiments, each of the remaining antenna elements 838 (those other than element 837 and 839) are each connected to a respective receiver (such as electrical circuit 99 configured as a receiver but not shown here) through a respective transmission line (such as transmission line 119 but not shown here), such that the antenna lengths of the transmitting antenna elements 837 and 839 and the passive and/or receiving antenna elements 838, can all be adjusted simultaneously, and optionally also individually. In some embodiments, a mechanical linkage is provided (e.g., such as shown in FIG. 4A and FIG. 4B) such that each of a plurality of the antenna elements is length-adjusted by a different amount (e.g., in some embodiments, by adjusting the tilt of movable frame 833 by a lever such as lever 449 connected to pivot 448 connected to fixed location 447 as shown in FIG. 4A). In some embodiments, a plurality of the antenna elements 838 are each a different length relative to one another (i.e., a first set of lengths applied to the set of antenna elements 838) at this setting of connecting rod 141.

FIG. 8F is a block diagram of variable antenna array subsystem 803 according to one embodiment of the present invention, wherein variable antenna array 830 is set to a second length that is different than the first length shown in FIG. 8E. As shown in FIG. 8F, the connecting rod 141 has been extended to the right, which has shortened each of a plurality of the antenna elements 838 by a respective physical-length amount controlled by electrical circuit 99, motor controller 145 and motor 140. In some embodiments, the plurality of the antenna elements 838 are each a different length relative to one another (i.e., a second set of lengths applied to the set of antenna elements 838 that is different than the first set of lengths shown and described for FIG. 8E above) at this setting of connecting rod 141.

FIG. 8G is a block diagram of an antenna array subsystem 806 having one or more active-variable-antenna element subsystems 804 and/or one or more passive-variable-antenna element subsystems 805 according to one embodiment of the present invention, wherein active-variable-antenna element subsystems 804 is set to a first impedance-frequency value and passive-variable-antenna element subsystems 805 is set to a second impedance-frequency value (in some embodiments, the first impedance-frequency value and the second impedance-frequency value are equal to one another). In some embodiments, each active-variable-antenna element subsystem 804 includes an electrical circuit 99 (e.g., each electrical circuit 99 is configured to transmit an RF signal to (and/or receive an RF signal from) its active-variable-antenna element subsystem 804) connected by a transmission line 119 through subsystem 804's series-connected variable capacitor 102' (i.e., the left-hand end of transmission line 119 is connected to the left-hand node of capacitor 102' of active-variable-antenna element subsystem 804, while the right-hand node of series-connected variable capacitor 102' of subsystem 804 is connected to the right-hand node of parallel-connected variable capacitor 102 of subsystem 804 and to the right-hand end of variable antenna 801 of subsystem 804) to subsystem 804's parallel-connected variable capacitor 102 (i.e., wherein parallel-connected capacitor 102 is connected between the right-hand node of series-connected variable capacitor 102' and electrical ground 896) and to a point (e.g., to one end) on subsystem 804's variable antenna element 801.

In some embodiments, each passive-variable-antenna element subsystem 805 is not connected to an electrical circuit 99 (in contrast to the passive-variable-antenna element subsystem(s) 805), but instead (in order to be otherwise symmetrical and equivalent to the active-variable-antenna element subsystem(s) 804) may be connected by a terminated transmission line 119' (e.g., in FIG. 8G, terminated transmission line 119' is shown connected at its right-hand end to a matched terminating resistive impedance 897 to a ground 898) through subsystem 805's series-connected variable capacitor 102' (i.e., the left-hand end of terminated transmission line 119' is connected to the left-hand node of capacitor 102' of passive-variable-antenna element subsystem 805, while the right-hand node of series-connected variable capacitor 102' of subsystem 805 is connected to the right-hand node of parallel-connected variable capacitor 102 of subsystem 805 and to the right-hand end of variable antenna 801 of subsystem 805) to subsystem 805's parallel-connected variable capacitor 102 (i.e., wherein parallel-connected capacitor 102 of subsystem 805 is connected between the right-hand node of series-connected variable capacitor 102' of subsystem 805 and electrical ground 896) and to a point (e.g., to one end) on variable antenna element 801 of subsystem 805. In some embodiments, the impedance of subsystem 805's circuit portion that includes antenna 801, parallel-connected capacitor 102 and series-connected capacitor 102' together, is matched to the impedance of terminated transmission line 119'. In other embodiments, series-connected variable capacitor 102' and terminated transmission line 119' are omitted (since they would be matched to the impedance of subsystem 805's antenna 801 and parallel-connected capacitor 102, and motor controller 141' controls the characteristics of parallel-connected variable capacitor 102 of subsystem 805 and of variable antenna 801 of subsystem 805 to match the characteristics of the one or more active-variable-antenna element subsystems 804.

In some such embodiments, the set of active-variable-antenna element subsystems 804 includes one or more elements 810 each connected to an RF transmitter (e.g., in some embodiments, two elements that are physically located ninety degrees apart are driven by two respective RF signals that have phases that are ninety degrees apart from each other) (e.g., see FIG. 8E). In some embodiments, the set of passive-variable-antenna element subsystems 805 includes one or more elements 810 each configured to shape and/or set a direction for the RF electromagnetic field created by the set of active-variable-antenna element subsystems 804 connected to the transmitter. In some embodiments, the set of active-variable-antenna element subsystems 804 also includes one or more elements 810 each connected to an RF receiver configured to receive an RF signal from its respective active-variable-antenna element subsystem 804. In some embodiments, such a set of active-variable-antenna element subsystems 804 configured to receive an RF signal is also part of the system used to shape and/or set a direction for the RF electromagnetic field created by the set of active-variable-antenna element subsystems 804 connected to the transmitter.

FIG. 8G1 (on the last sheet of Figures) is a circuit diagram of antenna array subsystem 806 having one or more active-variable-antenna element subsystems 804 and/or one or more passive-variable-antenna element subsystems 805 according to one embodiment of the present invention (such as shown in FIG. 8G). This is just a circuit diagram of the subsystem 806 shown in FIG. 8G described above.

In other embodiments, any combination of variable reactance elements (variable resistor elements, variable inductor elements and/or variable capacitor elements) can be substituted for the variable capacitors 102 and 102' shown in FIG. 8G and FIG. 8G1.

FIG. 8H is a block diagram of variable antenna array subsystem 807 according to one embodiment of the present invention, wherein variable antenna array 870 is set to a first dielectric configuration (which can be used to generally change the impedance, which affects the magnitude and phase angle of the signal in the RF field). In some such embodiments, a dielectric material such as a dielectric slug 872 is moved within the RF field of a plurality of antenna elements 875 and 876. Moving the dielectric slug 872 to different positions within the field of the array of antenna elements 875 and 876 changes the direction and/or shape of the field, and/or changes the resonant frequency and/or impedance of the antenna elements 875 and 876. In some embodiments, the movement of one or more of such dielectric slugs 872 is used to automatically adjust for other varying conditions such as the presence or physical movement of a patient in a magnetic-resonance machine for imaging.

FIG. 8i is a block diagram of variable antenna array subsystem 807 according to one embodiment of the present invention, wherein variable antenna array 870 is set to a second dielectric configuration. In some embodiments, the automatic movement to this second dielectric configuration compensates for the presence or movement of some other dielectric material (such as a person) in the RF field of the antenna elements 876 and 875.

FIG. 8J is a block diagram of variable antenna array subsystem 808 having a reconfigurable dielectric fluid according to one embodiment of the present invention, wherein variable antenna array 880 is set to a first dielectric-fluid configuration. The concept of moving dielectric material (in this case, a dielectric fluid) in variable antenna array subsystem 808 of FIG. 8J is similar to the concept of moving dielectric material (in that case, a dielectric solid) in variable antenna array subsystem 807 of FIG. 8H and FIG. 8i, except that subsystem 808 uses a pump 880 and tubing 881 to convey one or more volumes of dielectric fluid 882 and/or 883 into and out of (or back-and-forth between) corresponding chambers in the RF field of the plurality of antenna elements 876 and 875. When the dielectric fluid is pumped, a plurality of different dielectric configurations can be automatically controlled via circuit 99 and pump controller 885.

Figure 8K:
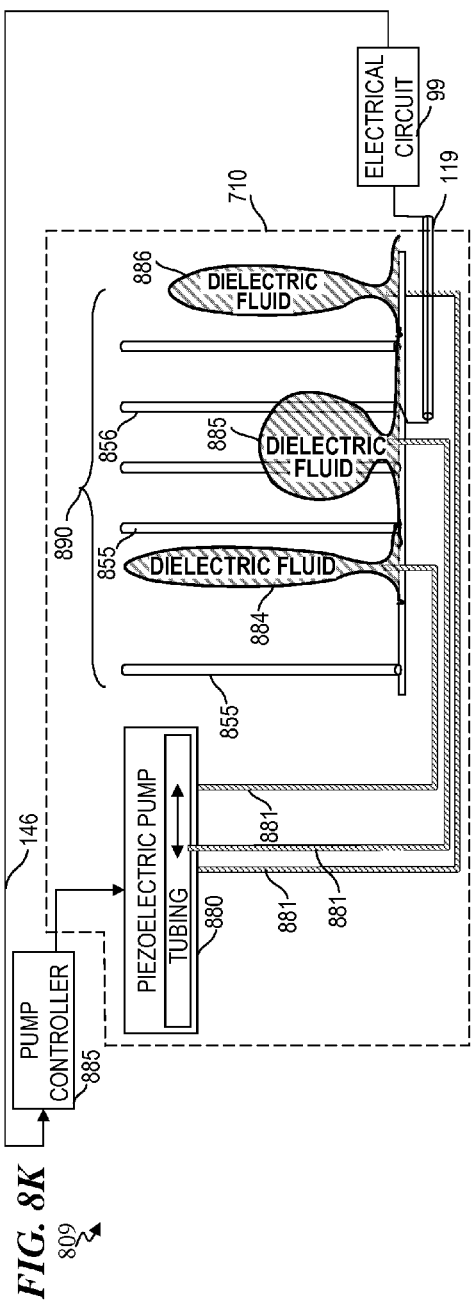
FIG. 8K is a block diagram of variable antenna array subsystem 809 having a reconfigurable dielectric fluid according to one embodiment of the present invention, wherein variable antenna array 890 is set to a first dielectric-fluid configuration.

Note that the dotted-line enclosure labeled 710 in FIG. 8J and FIG. 8K represents the environment in which the components therein are located (e.g., the remote environment labeled 710 in FIG. 7A). In each of the other Figures herein, a similar dotted line can be assumed to designate the non-magnetic mechanical movement device (e.g., motor 140 or pump 880) and the resistor, inductor, capacitor, antenna, dielectric, or mechanical devices that are controlled or varied by the non-magnetic mechanical movement device.

FIG. 8K is a block diagram of variable antenna array subsystem 809 having a reconfigurable dielectric fluid according to one embodiment of the present invention, wherein variable antenna array 890 is set to a first dielectric-fluid configuration. In some embodiments, subsystem 809 is conceptually similar to subsystem 808 of FIG. 8J, except that the shapes of the containers 884, 885 and 886 (e.g., bladders that can be filled or emptied and shaped to compensate for the presence or movement of other dielectric bodies such as a person) are variable (e.g., when the dielectric fluid is pumped, a plurality of different dielectric volume configurations can be automatically controlled via circuit 99 and pump controller 885, and the shape of the containers 884, 885 and 886 can be controlled by their inherent shape as manufactured and/or by the shapes they take on due to the presence or movement of a person pressing against them).

Figure 8L:
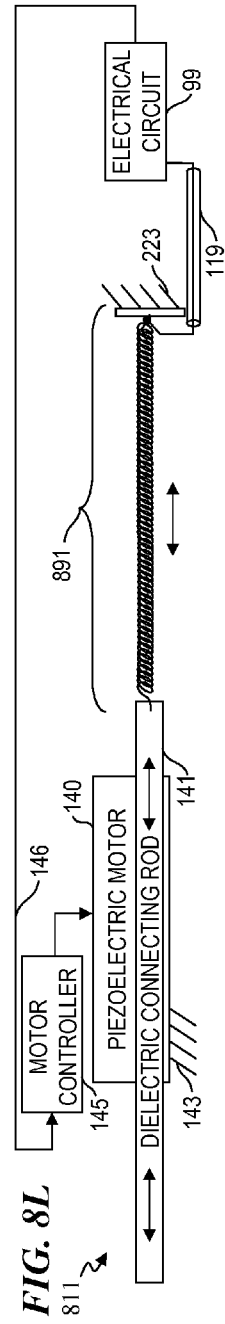
FIG. 8L is a block diagram of a variable antenna subsystem 811 according to one embodiment of the present invention, wherein variable antenna 891 is set to a first length.

FIG. 8L is a block diagram of a variable antenna subsystem 811 according to one embodiment of the present invention, wherein variable-length antenna 891 is set to a first length. In some embodiments, variable-length antenna 891 includes a small-diameter metal spring that can be extended from its relaxed state by pulling from connecting rod 141 to form an antenna whose length is controlled by motor 140, motor controller 145 and electrical circuit 99. In some embodiments, both the physical length and the electrical inductance of the antenna element 891 are varied as its length is extended or shortened by connecting rod 141.

Figure 8M:
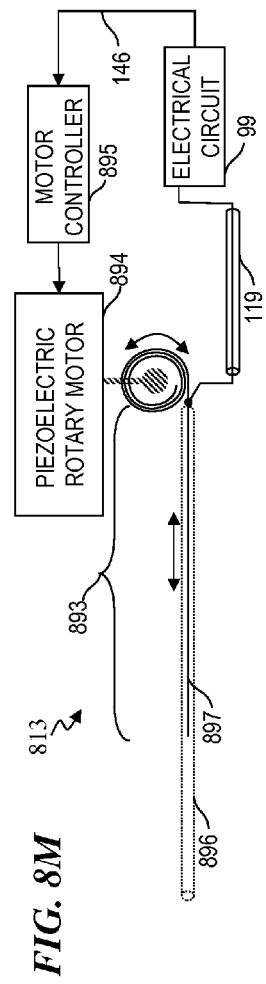
FIG. 8M is a block diagram of a variable antenna subsystem 813 according to one embodiment of the present invention, wherein variable antenna 893 is set to a first length.

FIG. 8M is a block diagram of a variable antenna subsystem 813 according to one embodiment of the present invention, wherein variable antenna 893 is set to a first length. In some embodiments, a rotary motor 894 rotates a spool of metal wire such that a variable length of wire 897 extends into a constrained linear shape (e.g., such as constraining the wire 897 to extend or shorten within a glass tube 896 (which in some embodiments, can be straight, or in other embodiments, can be curved to a variety of desired shapes (e.g., curves or spirals) by the shape of the tube 896).

FIG. 9 is a block diagram of feedback-controlled system 901 having one or more variable-resistance, variable inductance, variable capacitance, variable-antenna, variable-mechanical-position or shape robotics, variable-gain, variable-frequency ($\omega$) or variable-wavelength ($\lambda$), variable-phase ($\phi$), and like variable-component-value elements in a circuit 920, controlled by a feedback circuit 930 according to one embodiment of the present invention. In some embodiments, system 901 includes an input signal 960 that is transmitted to or in a circuit 920 in remote environment 910. Output signal 950 is the desired result, and in some embodiments, provides feedback signal 931 to feedback circuit 930, which generates a control signal 932 based on the feedback signal 931, wherein the control signal 932 is used to control electrically controlled non-magnetic mechanical movement devices to vary the variable-component-value or position or shape elements of circuit 920.

In some embodiments, the present invention provides an algorithm to drive the tuning and matching, which includes dual directional couplers that monitor the forward, $V^+$, and reflected, $V^-$, voltage at some distance, l, from the coil. The reflection coefficient, $\Gamma(l)$, is the ratio of the reflected to forward voltage at the dual directional couplers.

$$\Gamma(l) = \frac{V^-(l)}{V^+(l)} \qquad [\text{Eqn. 1}]$$

The reflection coefficient at the coil, $\Gamma(0)$ is:

$$\Gamma(0) = \frac{\Gamma(l)}{e^{-2\gamma l}} \quad [\text{Eqn. 2}]$$

where $\gamma$ is the complex propagation constant which takes into account of the cable's attenuation and phase constants.
The complex impedance of the coil, $Z_C$ is:

$$Z_C = Z_0 \frac{1 + \Gamma(0)}{1 - \Gamma(0)} = R_C + jX_C \quad [\text{Eqn. 3}]$$

where $Z_0$ is the nominal cable impedance (50Ω) and $R_C$ and $X_C$ the real and imaginary complex impedance of the coil, respectively. Tuning and matching the coil becomes simple. Tuning occurs by minimizing $jX_C$; similarly matching is defined by driving $R_C$ to 50Ω.

FIG. 10 is a flowchart of a method 1000 according to some embodiments of the invention. In some embodiments, method 1000 starts by selecting 1010 one or more (e.g., in some embodiments, a plurality of) criteria (in some embodiments, parameters such as impedance and frequency, in other embodiments, any other desired condition) to optimize. Next, a circuit (e.g., under control of non-magnetic mechanical movement devices) performs configuring 1011 for excitation (e.g., transmitting to or receiving from) the remote circuit elements. The next block includes delivering 1012 the excitation. The next block includes detecting 1014 a received signal from the remote elements. The next block includes checking 1015 for satisfactory parameters (e.g., the impedance and frequency of the signal) of the received signal from the remote elements. If the result is unsatisfactory, the method then includes adjusting 1017 one or more of the variable reactance elements using the non-magnetic mechanical movement device(s) and going to block 1011 to iteratively repeat the process 1011 through 1015. If the result of checking 1015 is satisfactory, the method goes to performing 1016 the operation for which the components were adjusted (e.g., obtaining a magnetic resonance result (such as an image).

In some embodiments, the present invention uses a piezo motor such as the model SQL-3.4 or the SQ-100 series devices available from Squiggle Motors, New Scale Technologies, Rochester, N.Y. (www.newscaletech.com/product_finder.html) or the model NEXACT N-310 available from NexLine/NexAct and PILine motors, Physik Instrumente (PI) GmbH & Co. Kg, Karlsruhe, Germany (e.g., a N-310 NEX-ACT® OEM Miniature Linear Motor/Actuator, which provides a Compact, High-Speed PiezoWalk® Drive, such as N-310 Actuator with E-861 Servo-Controller (integrated drive electronics) having a 20 mm standard travel range, a flexible choice of the runner length, a compact and cost-effective design, a 0.03 nm resolution, up to 10 n push/pull force, a low operating voltage, a self-locking rest position, no head dissipation, nanometer stability, and a non-magnetic and vacuum-compatible working principle, in a compact package of only 25×25×12 mm. (www.physikinstrumente.com/en/products/piezo_motor/linear_motor_selection.php?table=a11).

The present invention provides variable resistors, inductors and/or capacitors that have their electrical-circuit values controlled by one or more electrically controlled mechanical positioners. In some embodiments, the electrically controlled mechanical positioners (such as piezo-electrical linear motors) and other elements that are used to make the resistors, inductors and/or capacitors include metals that have only substantially non-magnetic components such that the resistors, inductors and/or capacitors and the mechanical positioner(s) that adjust their variable values can be placed and operated within and/or near an extremely high electric field of many thousands of volts (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

In other embodiments, the present invention provides the ability to adjust very sensitive circuits that do not involve high fields, but instead involve very low fields (such as within completely enclosed Faraday cages (which block low-frequency external fields) that also have radio-frequency (RF) shielding (which block high-frequency external fields) that are measuring very small parameters such as extremely low-voltage circuits where the presence of a person or magnetic motor would change the field, but use of the piezo-electric positioners and motors to adjust the configuration of RLC components without modifying fields or introducing extraneous capacitances or inductances.

Some embodiments of the invention include a method that includes providing an electrical component, and based on an electrical signal, automatically moving a movable portion of the electrical component in relation to another portion of the electrical component to vary at least one of its parameters.

In some embodiments of the method, the moving further comprises moving using a piezo-electric motor.

In some embodiments of the method, the electrical component includes an inductor, and wherein the at least one of its parameters includes an inductance. In some embodiments of the method, the electrical component includes a capacitor, and wherein the at least one of its parameters includes a capacitance. In some embodiments of the method, the electrical component includes a resistor, and wherein the at least one of its parameters includes a resistance.

Some embodiments of the method further include using a programmable information-processing device operatively coupled to control the moving of the movable portion of the electrical component in order to vary an electrical parameter of the electrical component.

Some embodiments of the method further include using an analog feedback-circuit device operatively coupled to control the moving of the movable portion of the electrical component in order to vary an electrical parameter of the electrical component.

Some embodiments of the method further include using a feedback signal operatively coupled to the programmable information-processing device to provide feedback control in order to maintain the electrical parameter of the electrical component.

Some embodiments of the invention include a computer-readable medium having instructions stored thereon for causing a suitably programmed information processor to execute a method that includes controlling moving of a movable portion of the electrical component in relation to another portion of the electrical component to vary at least one electrical parameter of the electrical component.

In some embodiments of the medium, the method further includes using a feedback signal operatively coupled to the programmable information-processing device to provide feedback control in order to maintain the electrical parameter of the electrical component.

In some embodiments of the medium, the method further includes controlling resistance, inductance and capacitance (RLC) values of a circuit. In some embodiments of the medium, the method further includes controlling antenna length, resonant frequency, impedance matching between transmitters, transmission lines and receivers of a signal, and/or shape, direction, and/or amplitude of a static and/or temporally varying AC electromagnetic field.

Some embodiments of the invention include an apparatus that includes a non-magnetic positioner, and an electrical component connected to the motor and configured to have at least one of its parameters varied by the positioner. In some embodiments of the apparatus, the positioner comprises a piezo-electric motor. In some embodiments of the apparatus, the electrical component includes an inductor, and wherein the at least one of its parameters includes an inductance. In some embodiments of the apparatus, the electrical component includes a capacitor, and wherein the at least one of its parameters includes a capacitance. In some embodiments of the apparatus, the electrical component includes a resistor, and wherein the at least one of its parameters includes a resistance. Some embodiments further include a programmable information-processing device operatively coupled to control the positioner in order to vary an electrical parameter of the electrical component. Some embodiments further include a feedback circuit operatively coupled to the programmable information-processing device to provide feedback control of the positioner in order to maintain the electrical parameter of the electrical component.

Some embodiments of the invention include an apparatus that includes an electrical component, and means, as described and shown herein and equivalents thereof, for automatically moving, based on an electrical signal, a movable portion of the electrical component in relation to another portion of the electrical component to vary at least one of its parameters. In some embodiments of the apparatus, the means for automatically moving further comprises means for automatically moving using a piezo-electric motor. In some embodiments of the apparatus, the electrical component includes an inductor, and wherein the at least one of its parameters includes an inductance. In some embodiments of the apparatus, the electrical component includes a capacitor, and wherein the at least one of its parameters includes a capacitance. In some embodiments of the apparatus, the electrical component includes a resistor, and wherein the at least one of its parameters includes a resistance. Some embodiments of the apparatus further include a programmable information-processing device operatively coupled to control the means for automatically moving of the movable portion of the electrical component in order to vary an electrical parameter of the electrical component. Some embodiments of the apparatus further include means for automatically controlling using feedback control in order to maintain the electrical parameter of the electrical component.

In some embodiments, the method of the present invention is executed on a computer at a location remote from a user, and controlled by the user across the internet. In some embodiments, the method is executed on a computer at a location remote from the variable electrical components. In some such embodiments, the method is controlled by the computer across a network.

In some embodiments, the system of the present invention includes one or more non-magnetic (e.g., piezoelectric) motors adjusted by its own respective motor controller(s) and feedback circuit(s) to robotically move mechanical parts (levers, hoops, sheets of resilient elastic material, and the like) to achieve robotic control within the high-field or sensitive-field environment in which the RLC and/or antenna elements are adjusted by their own respective motor controllers and feedback circuits. In some such embodiments, the system sets an initial set of parameters (for example, resistance, inductance, capacitance, dielectric shape, frequency, phase, gain/attenuation, temporal properties, spatial properties (the shape of magnetic or electric fields), pulse width, mechanical position and orientation, or other controlled parameter) and a feedback circuit senses the result (one or more characteristics or parameters) and automatically adjusts the components (for example, variable resistors, inductors, capacitors, antennas, dielectric shapes, mechanical positioners and the like) in the system to compensate or control the system to achieve a desired result (e.g., a radar signal, magnetic-resonance or electron-spin image, or other desired system output).

In some embodiments, the one or more non-magnetic (e.g., piezoelectric) motors actuate control over electrical switches, amplitude modulators, frequency controllers, phase controllers, gain controllers, frequency modulators and the like by using, for example, control of variable resistor(s), inductor(s), capacitor(s), antenna(s), dielectric shape(s), mechanical positioner(s) and the like.

In some embodiments, the system uses non-magnetic (e.g., piezoelectric) motors (or other mechanical-movement devices) that include linear actuators, rotary actuators, pumps (pneumatic (pressure or vacuum) and/or liquid pumps) and/or the like. In some embodiments, the system optionally includes non-magnetic sensors (e.g., using piezoelectric or other suitable technologies) that include linear strain gauges, rotary sensors, pressure or sound sensors (e.g., pneumatic (pressure or vacuum) and/or liquid), position sensors, light and image sensors, voltage or current sensors, and/or the like. In some embodiments, such actuator elements and/or sensor elements are used for remotely controlled robotic diagnosis and examination, surgery, biopsy, and the like in a medical environment (such as a magnetic-resonance machine).

In some embodiments, the present invention includes one or more of any one or more of the devices in any of the figures herein in a combined circuit that connects the described variable components, optionally including other conventional components.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:
   providing an electrical component having a characteristic impedance at a first frequency; and
   based on an electrical feedback signal, automatically moving, using a non-magnetic mechanical-movement device, a movable portion of the electrical component in relation to another portion of the electrical component to adjust the characteristic impedance at the first frequency.

2. The method of claim 1, wherein the moving using the non-magnetic mechanical-movement device comprises moving using a piezo-electric motor.

3. The method of claim 1, wherein the electrical component comprises an inductor, and wherein the at least one of its parameters includes an inductance.

4. The method of claim 1, wherein the electrical component comprises a capacitor, and wherein the at least one of its parameters includes a capacitance.

5. The method of claim 1, wherein the electrical component comprises a resistor, and wherein the at least one of its parameters includes a resistance.

6. The method of claim 1, further comprising using a programmable information-processing device operatively coupled to control the moving of the movable portion of the electrical component in order to vary an electrical parameter of the electrical component.

7. The method of claim 6, further comprising using a feedback signal operatively coupled to the programmable information-processing device to provide feedback control in order to maintain the electrical parameter of the electrical component.

8. The method of claim 1, wherein the electrical component comprises an antenna element, and wherein the automatically moving, using a non-magnetic mechanical-movement device includes adjusting an electrical length of the antenna element.

9. The method of claim 1, wherein the electrical component comprises a plurality of antenna elements, and wherein the automatically moving, using a non-magnetic mechanical-movement device includes adjusting a resonant frequency and a characteristic impedance of the plurality of antenna elements at the resonant frequency.

10. An apparatus comprising:
a non-magnetic mechanical-movement device;
a feedback controller; and
an electrical component, characterized by a plurality of electrical parameters, connected to the non-magnetic mechanical-movement device, and configured to have at least one of the plurality of electrical parameters automatically varied by the non-magnetic mechanical-movement device under control of the feedback controller.

11. The apparatus of claim 10, wherein the non-magnetic mechanical-movement device comprises a piezo-electric motor.

12. The apparatus of claim 10, wherein the electrical component comprises an inductor, and wherein the at least one of the plurality of electrical parameters includes an inductance.

13. The apparatus of claim 10, wherein the electrical component comprises a capacitor, and wherein the at least one of the plurality of electrical parameters includes a capacitance.

14. The apparatus of claim 10, wherein the electrical component comprises a resistor, and wherein the at least one of the plurality of electrical parameters includes a resistance.

15. The apparatus of claim 10, further comprising a programmable information-processing device operatively coupled to control the non-magnetic mechanical-movement device in order to vary at least one of the plurality of electrical parameters of the electrical component.

16. The apparatus of claim 15, further comprising a feedback circuit operatively coupled to the programmable information-processing device to provide feedback control of the positioner in order to maintain the electrical parameter of the electrical component.

17. The apparatus of claim 10, further comprising
a computer-readable medium having instructions stored thereon for causing a suitably programmed information processor to execute a method that includes:
autocontrolling the non-magnetic mechanical-movement device to move a movable portion of the electrical component in relation to another portion of the electrical component to vary at least one of the plurality of electrical parameters of the electrical component.

18. The apparatus of claim 10, wherein the computer-readable medium includes instructions stored thereon to cause the method to further comprise using a feedback signal operatively coupled to the programmable information-processing device to provide feedback control in order to maintain the at least one of the plurality of electrical parameters of the electrical component.

19. The apparatus of claim 10, wherein the computer-readable medium includes instructions stored thereon to cause the method to further comprise controlling a resonant frequency and a characteristic impedance of a circuit that includes the electrical component.

20. An apparatus comprising:
means for adjusting a characteristic impedance of an electrical component at a first frequency; and
non-magnetic mechanical-movement means for automatically moving, based on an electrical signal, a movable portion of the electrical component in relation to another portion of the electrical component to vary at least one of its parameters and thereby control the means for adjusting the characteristic impedance at the first frequency.

21. The apparatus of claim 20, wherein the non-magnetic mechanical-movement means for automatically moving further comprises a piezo-electric motor.

22. The apparatus of claim 20, further comprising a programmable information-processing device operatively coupled to control the means for automatically moving of the movable portion of the electrical component in order to vary an electrical parameter of the electrical component.

23. The apparatus of claim 22, further comprising means for automatically controlling using feedback control in order to maintain the electrical parameter of the electrical component.

24. A method comprising:
providing an electrical component that includes a first antenna element having an adjustable resonant frequency; and
based on an electrical signal, automatically moving, using a non-magnetic mechanical-movement device, a movable portion of the electrical component in relation to another portion of the electrical component to vary the adjustable resonant frequency.

25. The method of claim 24, wherein the electrical signal is a feedback signal, and wherein the moving using the non-magnetic mechanical-movement device comprises moving using a piezo-electric motor.

26. The method of claim 24, wherein the electrical component has an adjustable inductance, and wherein the automatically moving, using the non-magnetic mechanical-movement device, a movable portion of the electrical component in relation to another portion of the electrical component, varies the adjustable inductance.

27. The method of claim 24, wherein the electrical component comprises a capacitor, and wherein the automatically moving, using the non-magnetic mechanical-movement device, moves a movable portion of the capacitor in relation to another portion of the capacitor and thus varies a capacitance.

* * * * *